(12) United States Patent
Nakajima et al.

(10) Patent No.: US 8,017,466 B2
(45) Date of Patent: Sep. 13, 2011

(54) SEMICONDUCTOR DEVICE AND MANUFACTURING METHOD FOR THE SAME

(75) Inventors: Kazuaki Nakajima, Kanagawa (JP); Kyoichi Suguro, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/591,162

(22) Filed: Nov. 10, 2009

(65) Prior Publication Data

US 2010/0062596 A1    Mar. 11, 2010

Related U.S. Application Data

(62) Division of application No. 11/395,278, filed on Apr. 3, 2006, now Pat. No. 7,635,631.

(30) Foreign Application Priority Data

Apr. 4, 2005    (JP) .................................. 2005-107937

(51) Int. Cl.
   *H01L 21/8238*    (2006.01)
(52) U.S. Cl. ........................ 438/199; 438/275; 438/976
(58) Field of Classification Search .................. 438/199, 438/275, 976
   See application file for complete search history.

(56) References Cited

U.S. PATENT DOCUMENTS

| 6,027,961 | A |   | 2/2000 | Maiti et al. |
| 6,162,741 | A | * | 12/2000 | Akasaka et al. ............... 438/773 |
| 6,171,910 | B1 |  | 1/2001 | Hobbs et al. |
| 6,291,282 | B1 |  | 9/2001 | Wilk et al. |
| 6,373,111 | B1 |  | 4/2002 | Zheng et al. |
| 7,041,543 | B1 |  | 5/2006 | Varadarajan et al. |
| 2005/0170104 | A1 |  | 8/2005 | Jung et al. |
| 2006/0115940 | A1 |  | 6/2006 | Kim et al. |

FOREIGN PATENT DOCUMENTS

| JP | 2000-31296 | 1/2000 |
| JP | 2000-252371 | 9/2000 |
| JP | 2006-157015 | 6/2006 |

* cited by examiner

*Primary Examiner* — Zandra V. Smith
*Assistant Examiner* — Christy L Novacek
(74) *Attorney, Agent, or Firm* — Finnegan, Henderson, Farabow, Garrett & Dunner, L.L.P.

(57) ABSTRACT

In a semiconductor substrate on which are formed an N-type MOS transistor and a P-type MOS transistor, the gate electrode of the N-type MOS transistor comprises a tungsten film, which makes contact with a gate insulation film, and the gate electrode of the P-type MOS transistor comprises a tungsten film, which makes contact with a gate insulation film, and the concentration of carbon contained in the former tungsten film is less than the concentration of carbon contained in the latter tungsten film.

5 Claims, 14 Drawing Sheets

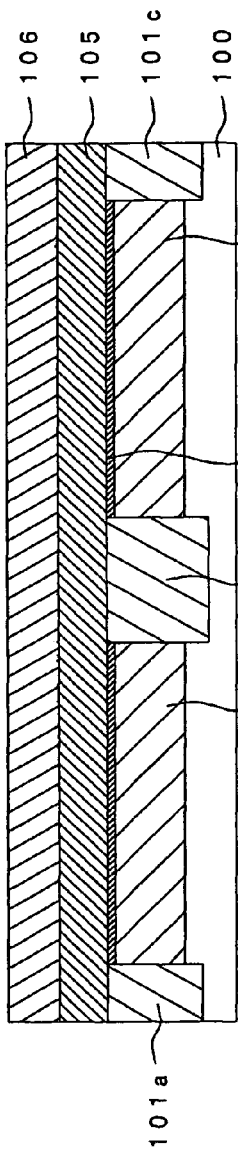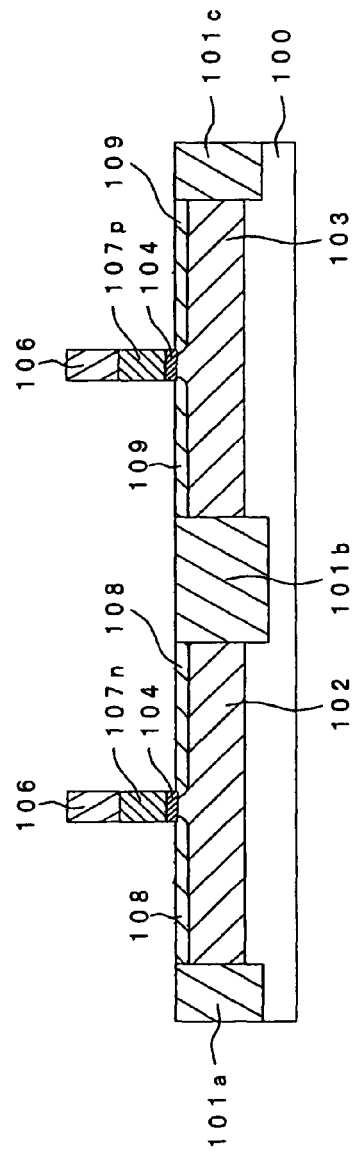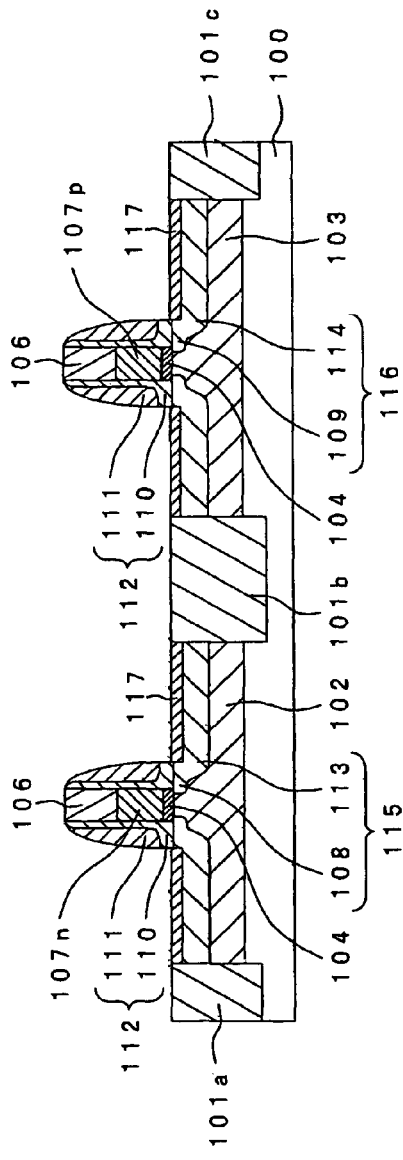

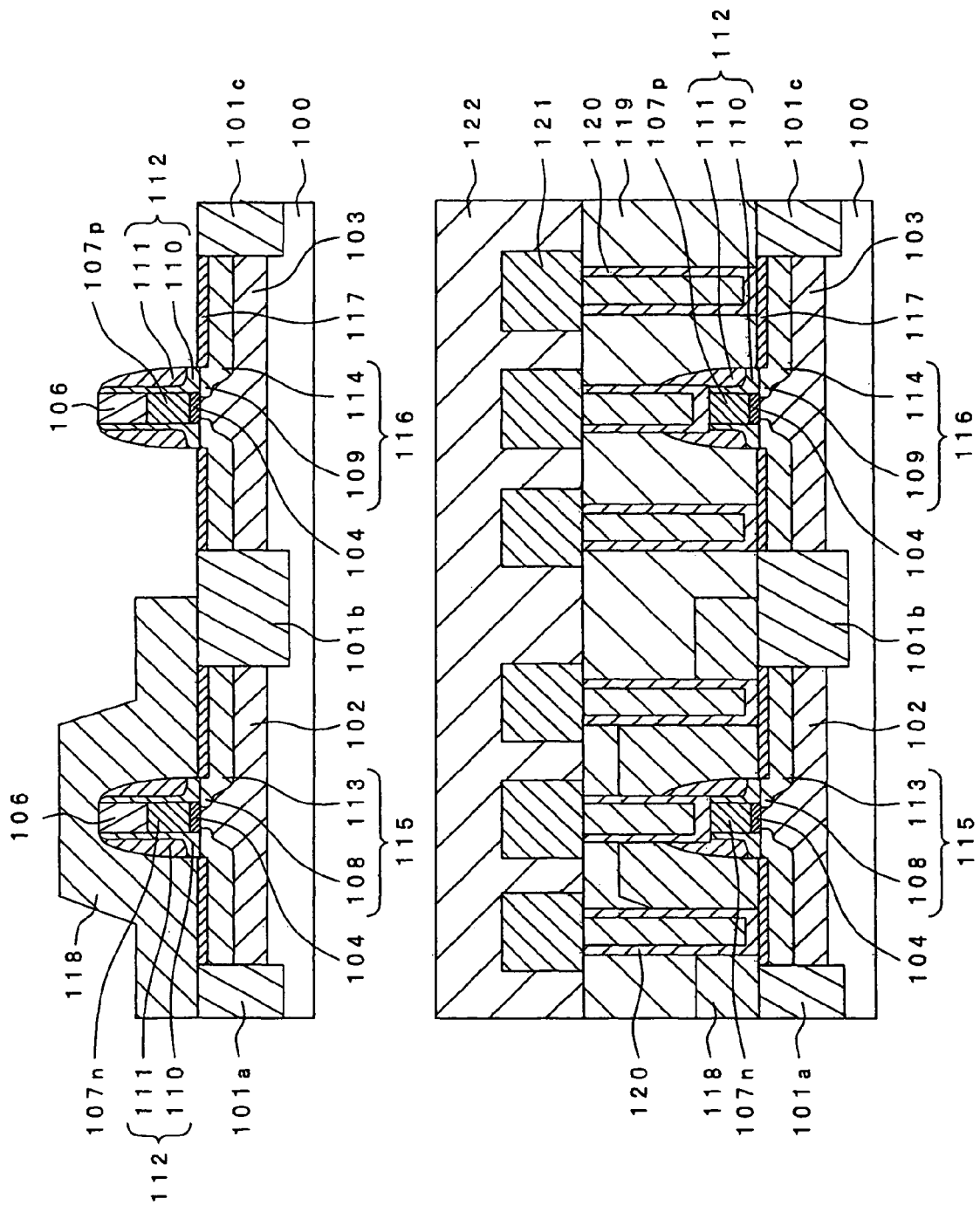

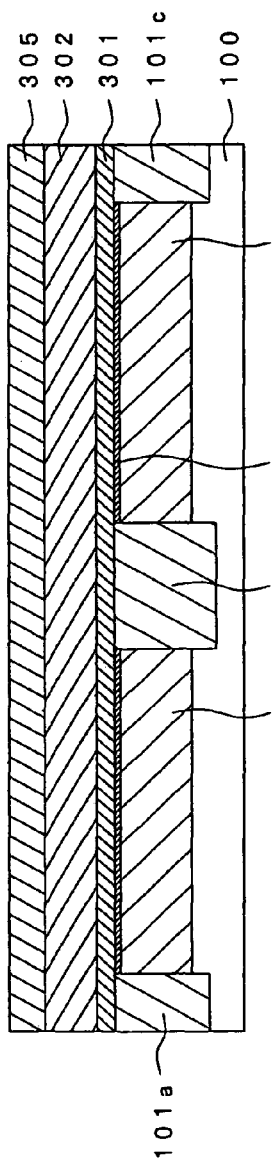
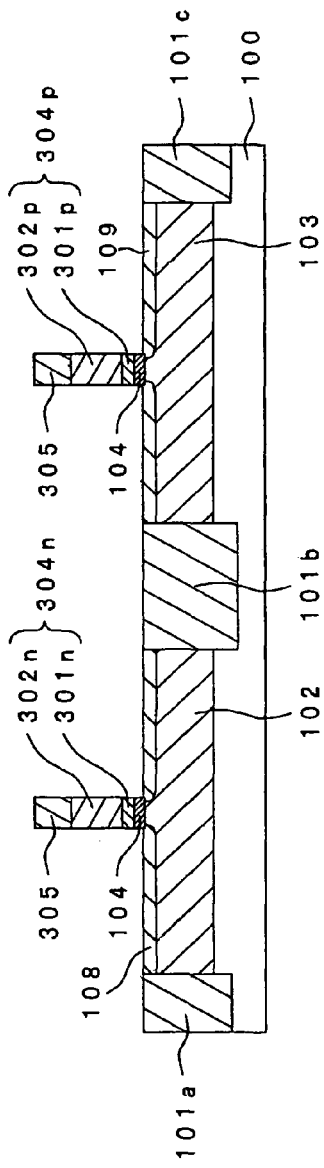
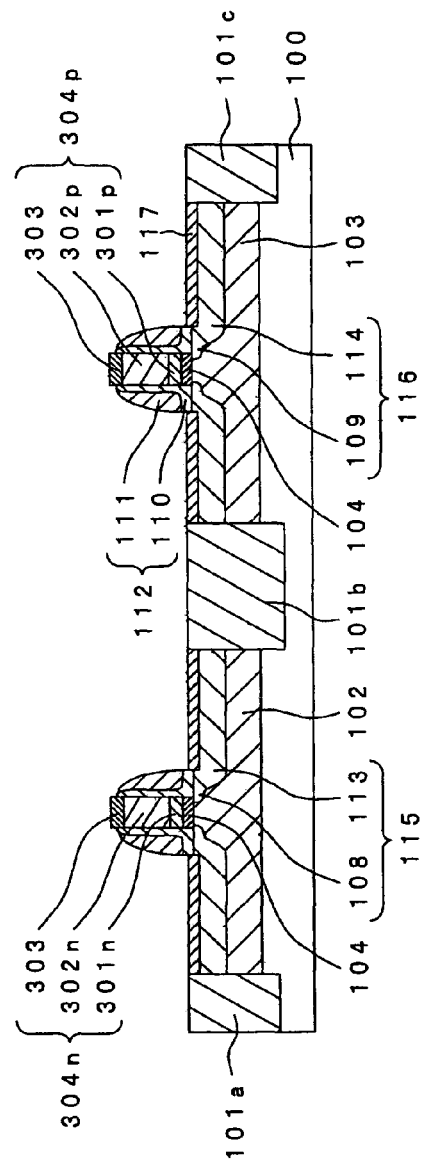

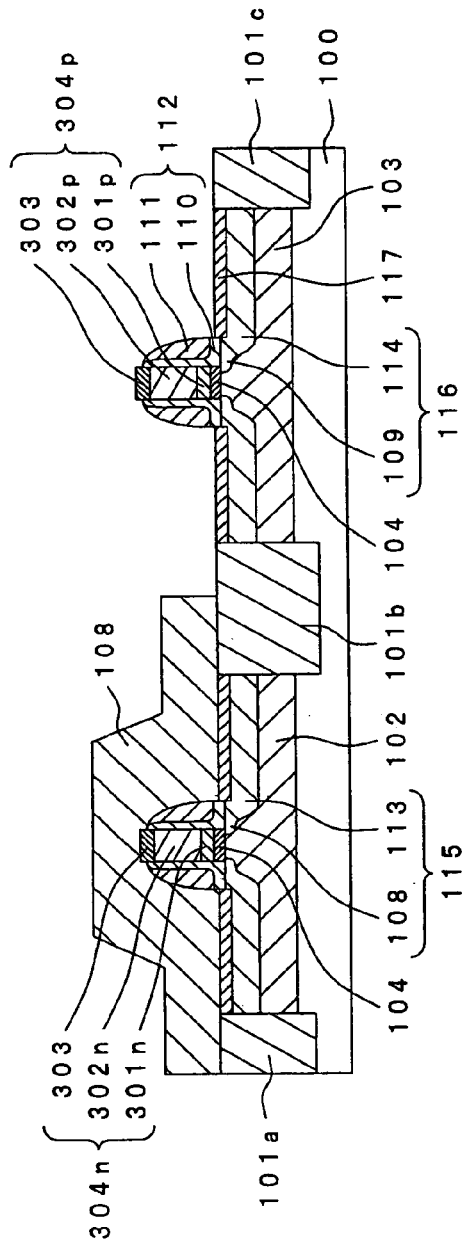
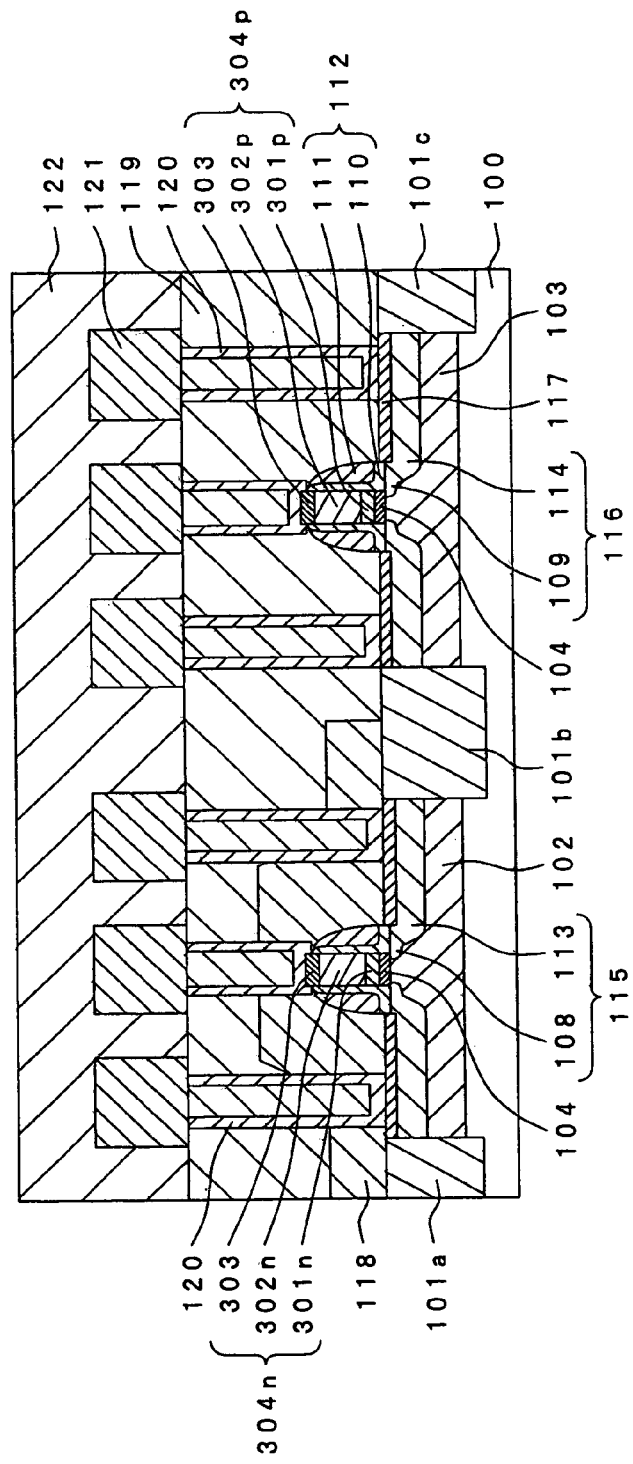
FIG.5D
FIG.5E

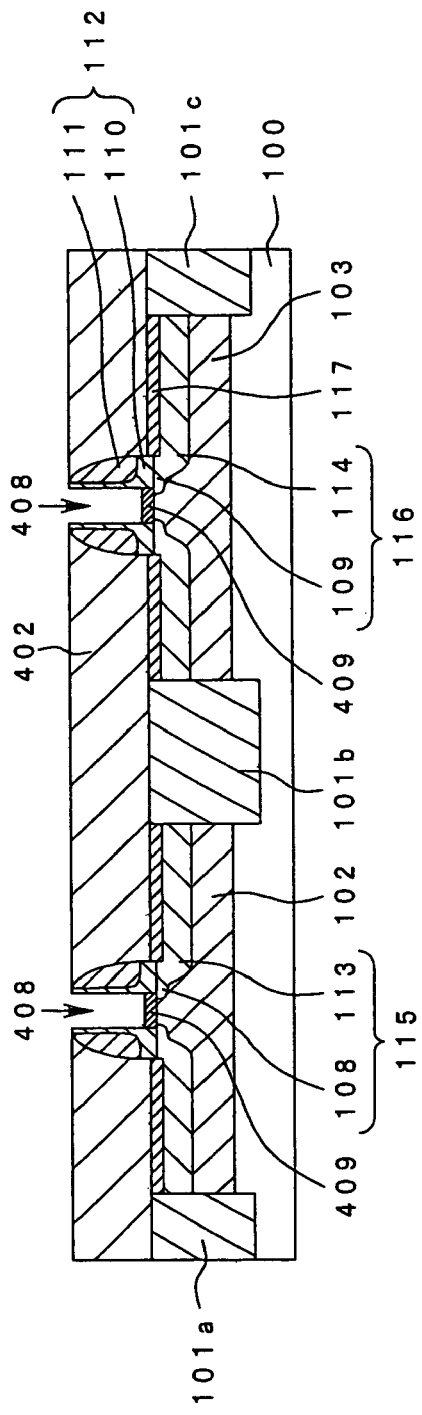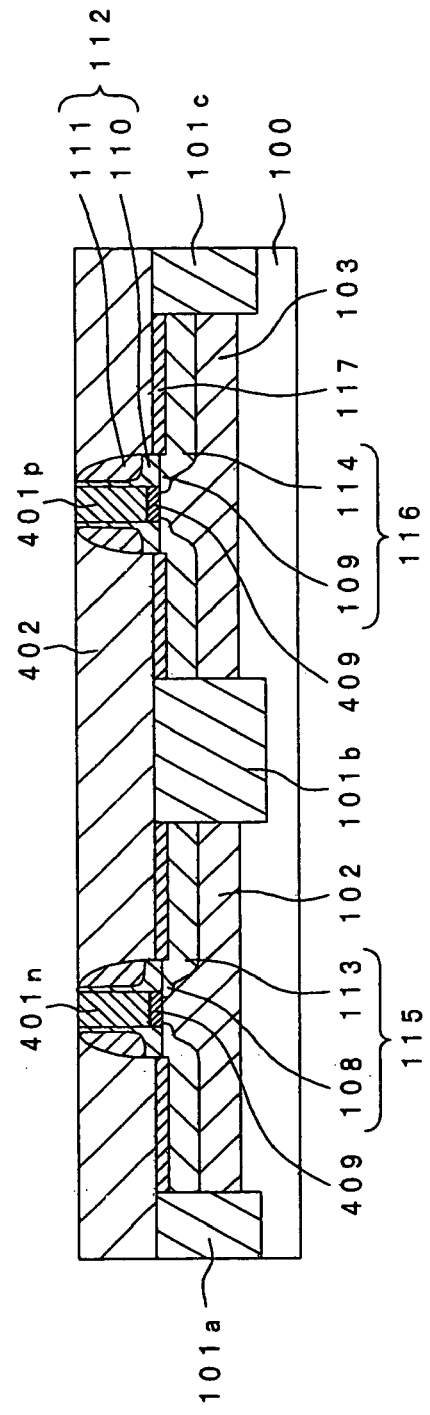

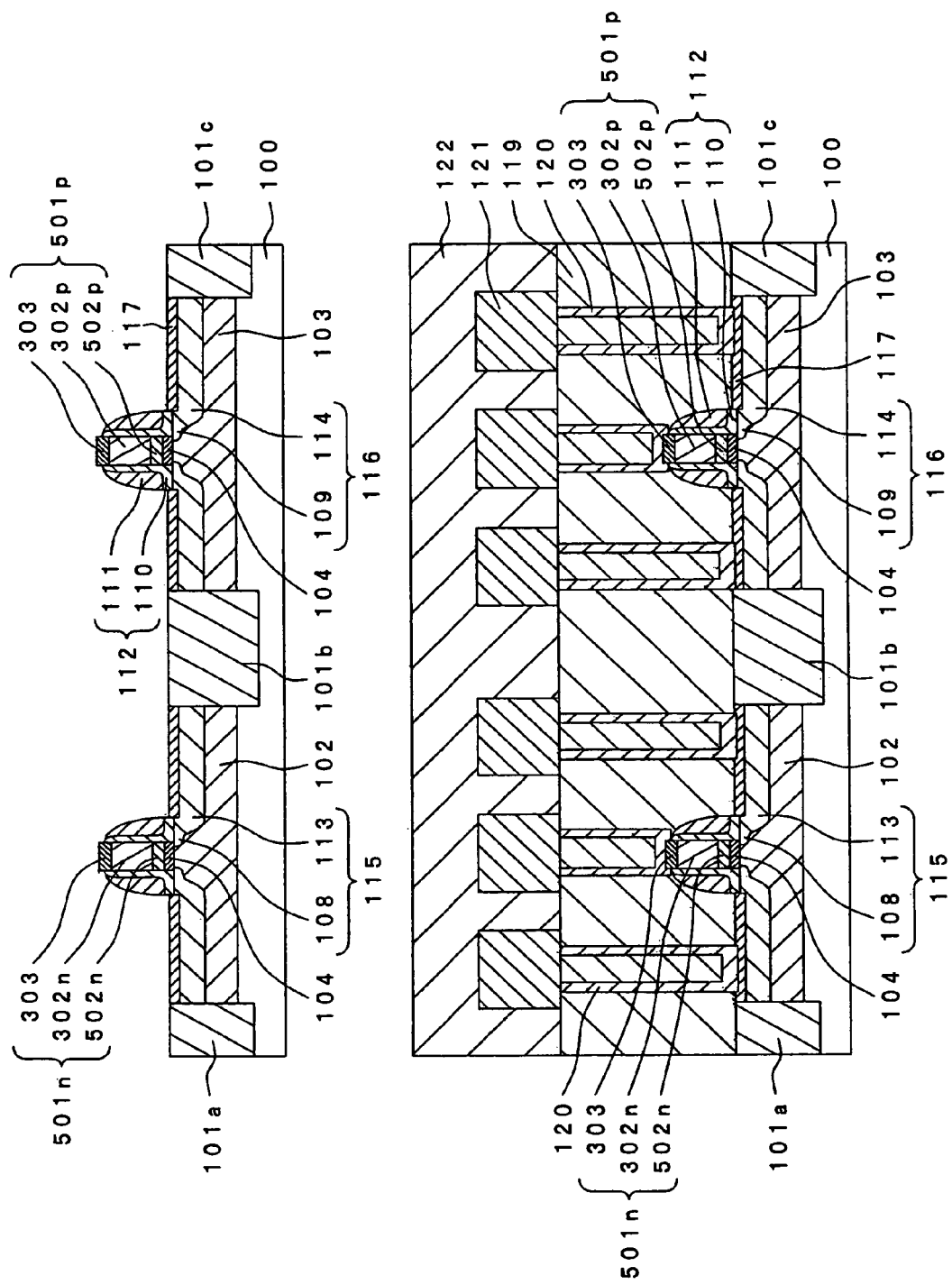

SEMICONDUCTOR DEVICE AND MANUFACTURING METHOD FOR THE SAME

This is a division of application Ser. No. 11/395,278, filed Apr. 3, 2006 now U.S. Pat. No, 7,635,631, which is incorporated herein by reference.

CROSS-REFERENCE TO PRIOR APPLICATION

This application is based upon and claims the benefit of priority from the prior Japanese Patent Application No. 2005-107937, filed on Apr. 4, 2005, the entire contents of which are incorporated herein by reference.

BACKGROUND OF THE INVENTION

1. Field of the Invention

The present invention relates to a semiconductor device and a manufacturing method for the same, and more particularly to a semiconductor device comprising an N-type MOS transistor and a P-type MOS transistor, which utilize conductor films in the gate electrodes, and to a manufacturing method for the same.

2. Description of the Related Art

Device downscaling has been pursued in order to achieve a higher performance MOSFET (Metal Oxide Semiconductor Field Effect Transistor), and also the need to reduce power consumption has been increased in addition to the device downscaling. In order to reduce power consumption, it is necessary to keep the threshold value of a transistor at a low value. Therefore, gate electrodes having different work functions have been used for N-type MOSFET and P-type MOSFET, respectively.

Generally speaking, polycrystalline silicon (polysilicon) is utilized in the gate electrode of a transistor, and a low threshold value is achieved by doping impurities into the polysilicons, which are the gate electrode of N-type MOSFET and P-type MOSFET, converting these polysilicons to n-type polysilicon and p-type polysilicon, respectively, and setting the work function of the respective polysilicons in the proximity of the conduction band and valence band.

However, in a gate electrode comprised of polysilicon, even if doping is done in high concentrations so that the impurity concentration is at the $10^{20}$ cm$^{-3}$ level, which is the solid solubility limit of a conductive impurity, because a depletion layer is formed on the gate electrode side, gate capacitance decreases to that extent. Thus, when forming a gate insulation film, it is necessary to make it approximately 0.5 nm thinner in anticipation of depletion layer gate capacitance, but the current situation is such that it is difficult to make the gate insulation film thinner due to the problem of gate leakage current increase caused by a gate insulation film tunnel current.

As measures for avoiding the problem, increasing the dielectric constant of the gate insulation film, and the utilization of metal gate electrodes are being studied. Increasing the dielectric constant of the gate insulation film achieves the physical thickness of the gate insulation film, and holds down tunnel current by replacing the gate insulation film with a high dielectric layer. Recently, the development of materials for high dielectric gate insulation films has been vigorously pursued, but these materials have yet to reach the point where they can be considered as much reliable as the conventional silicon oxide layer, and it will still be some time before they can be applied to actual devices.

The use of a metal gate electrode prevents the depletion of the gate electrode by replacing the polysilicon gate electrode by metal one. When a metal gate electrode is employed to maintain the threshold value of the transistor at a low value, a device is formed by using a metal having a work function in the vicinity of 4.0 eV, which is the conduction band of silicon, as the gate electrode material in an N-type MOSFET, and using a metal having a work function in the vicinity of 5.1 eV, which is the valence band of silicon, as the gate electrode material in a P-type MOSFET (for example, refer to Japanese Laid-open Patent No. 2000-31296 (corresponding U.S. Pat. No. 6,027,961) and Japanese Laid-open Patent No. 2000-252371 (corresponding U.S. Pat. No. 6,291,282)).

However, in a conventional device, which uses polysilicon for the gate electrode, the formation of the gate electrodes of the N-type MOSFET and the P-type MOSFET is carried out simultaneously, but in manufacturing the device disclosed in Japanese Laid-open Patent No. 2000-31296 (corresponding U.S. Pat. No. 6,027,961), the problem was that the formation of the respective gate electrodes was carried out separately, thereby greatly increasing the number of processes.

With the forgoing in view, it is an object of the present invention to provide a semiconductor device and manufacturing method therefor, which makes possible the formation of metal gate electrodes having different work functions in a P-type MOSFET and an N-type MOSFET without significantly increasing the number of manufacturing processes.

BRIEF SUMMARY OF THE INVENTION

A semiconductor device related to a first aspect of the present invention comprises an N-type MOS transistor having a first gate electrode comprising a first conductor film, which comes in contact with the gate insulation film, and a P-type MOS transistor having a second gate electrode comprising a second conductor film, which comes in contact with the gate insulation film, and which contains carbon in a higher concentration than the concentration of carbon contained in the above-mentioned first conductor film.

A manufacturing method of a semiconductor device related to a second aspect of the present invention is a manufacturing method of a semiconductor device, on which are formed an N-type MOS transistor and a P-type MOS transistor, comprising the steps of forming a gate insulation film on a semiconductor substrate; forming a conductor film, which constitutes a gate electrode, on the above-mentioned gate insulation film, in accordance with a manufacturing method that uses an organic material; forming an insulation film, which contains hydrogen, so as to cover at the least a part of the above-mentioned gate electrode of the above-mentioned N-type MOS transistor; and heating the above-mentioned semiconductor substrate, on which the above-mentioned insulation film is formed, in a non-oxidizing environment.

Another manufacturing method of a semiconductor device related to a third aspect of the present invention is a manufacturing method of a semiconductor device, on which are formed an N-type MOS transistor and a P-type MOS transistor, comprising the steps of forming a gate insulation film on a semiconductor substrate; forming a conductor film, which constitutes a gate electrode, on the surface of the above-mentioned gate insulation film, in accordance with a manufacturing method that uses an organic material; forming an insulation film so as to cover at the least a part of the above-mentioned gate electrode of the above-mentioned P-type MOS transistor; and heating the above-mentioned semiconductor substrate, on which the above-mentioned insulation film is formed, in a combination of an oxidizing environment and a educing environment.

BRIEF DESCRIPTION OF THE DRAWINGS

FIGS. 2A, 2B, 2C, 2D and 2E are cross-sectional views illustrating manufacturing processes of a semiconductor device related to the first embodiment of the present invention;

FIGS. 5A, 5B, 5C, 5D and 5E are cross-sectional views illustrating manufacturing processes of a semiconductor device related to the second embodiment of the present invention;

FIGS. 7A, 7B, 7C, 7D, 7E, 7F and 7G are cross-sectional views illustrating manufacturing processes of a semiconductor device related to the third embodiment of the present invention;

FIGS. 9A, 9B, 9C, 9D and 9E are cross-sectional views illustrating manufacturing processes of a semiconductor device related to the fourth embodiment of the present invention.

DESCRIPTION OF THE PREFERRED EMBODIMENT

The embodiments of the present invention will be explained below by referring to the figures.

First Embodiment

Figure 1:
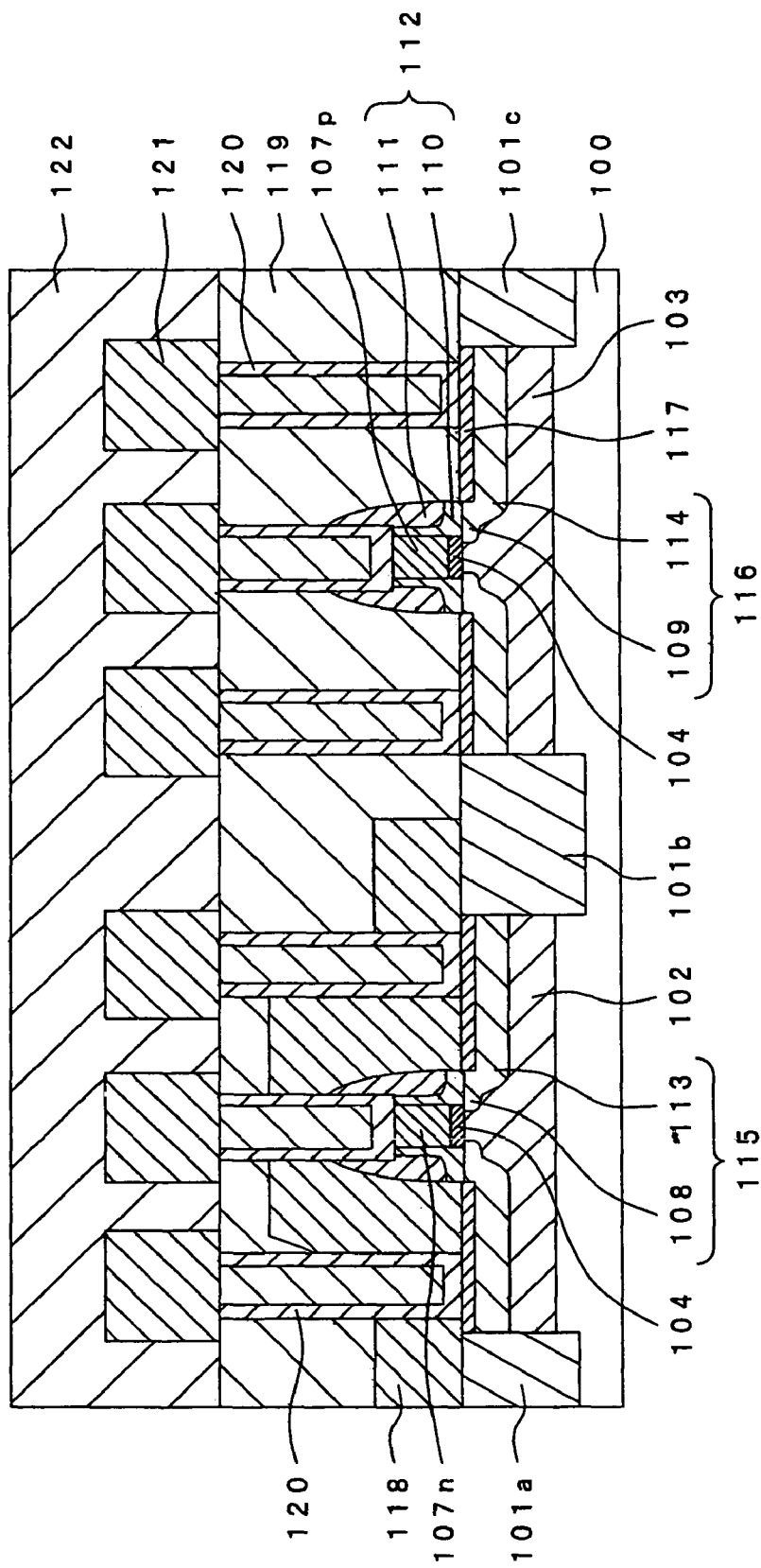
FIG. 1 is a simplified cross-sectional view illustrating a structure of a semiconductor device related to a first embodiment of the present invention.

To begin with, a structure of a semiconductor device related to a first embodiment of the present invention will be explained using FIG. 1. FIG. 1 is a simplified cross-sectional view illustrating a structure of a semiconductor device related to a first embodiment of the present invention. As shown in FIG. 1, element-separating insulation layers 101a through 101c, which delineate element regions, are formed on a silicon substrate 100 having a single-crystal crystalline structure. MOSFETs are formed in regions, which are separated by an element-separating insulation film 101. In FIG. 1, the region separated by the element-separating insulation film 101a located on the left side of the figure and the element-separating insulation film 101b located in the center of the figure is an N-type MOSFET formation region, and the region separated by the element-separating insulation film 101b located in the center of the figure and the element-separating insulation film 101c located on the right side of the figure is a P-type MOSFET formation region.

A p-well 102 is formed inside the silicon substrate 100 of the N-type MOSFET formation region. Also, a gate electrode 107n comprising tungsten (W) as a first conductor film is formed, with a gate insulation film 104 interposed, on the silicon substrate 100 of the N-type MOSFET formation region. Conversely, an n-well 103 is formed inside a silicon substrate 100 of a P-type MOSFET formation region. Also, a gate electrode 107p comprising tungsten (W) as a second conductor film is formed, with a gate insulation film 104 interposed, on the silicon substrate 100 of the P-type MOSFET formation region.

The concentration of carbon contained in the tungsten of gate electrode 107n is kept lower than the concentration of carbon contained in the tungsten of gate electrode 107p, and this keeps the work function of gate electrode 107n lower than the work function of gate electrode 107p. For example, in the first embodiment, the work function of gate electrode 107n can be made about 0.8 eV lower than the work function of gate electrode 107p. For example, the work function of gate electrode 107n can be set at 4.1 eV, and the work function of gate electrode 107p can be set at 4.9 eV. In this case, because the N-type MOSFET has a tungsten-comprised gate electrode 107n, which has a work function in the vicinity of 4.0 eV, which is the conduction band of silicon, and the P-type MOSFET has a tungsten-comprised gate electrode 107p, which has a work function in the vicinity of 5.1 eV, which, is the valence band of silicon, the transistor threshold value can be held to a low value, and power consumption can be reduced. Further, since tungsten is used as the material of the gate electrodes 107n, 107p, gate electrode depletion can be prevented.

A gate-sidewall insulation film 112 comprising a silicon nitride layer 110 and a silicon oxide layer 111 is formed in the both sidewalls of the respective gate electrodes 107n and 107p. Further, source/drain diffusion layers 115, 116 are formed respectively inside the silicon substrate 100 at both sides of the respective gate electrodes 107n and 107p. The source/drain diffusion layers 115, 116 have a LDD (lightly doped drain) structure, and are formed from shallow diffusion layers 108, 109 for which the impurity concentration is kept low, and deep diffusion layers 113, 114 for which the impurity concentration is made high. Having the LDD structure suppresses the generation of hot electrons. A nickel (Ni) silicide layer 117 is formed on the surface of the source/drain diffusion layers 115, 116.

A passivation layer 118 is formed on the surface of the silicon substrate 100 of the N-type MOSFET formation region and gate-sidewall insulation film 112 so as to cover the gate electrode 107n. The passivation layer 118 is a silicon nitride layer containing, for example, hydrogen, and the in-layer hydrogen concentration is $1E+21$ cm$^{-3}$. If the passivation layer 118 is an insulation film, which contains $1E+21$ cm$^{-3}$ or more of hydrogen, it is not limited to a silicon nitride layer, and, for example, can also be a silicon oxide layer containing hydrogen.

A first interlayer insulation film 119 is formed on the surface of the passivation layer 118, which is formed on the silicon substrate 100 of the P-type MOSFET formation region, gate electrode 107n, gate-sidewall insulation film 112, and N-type MOSFET formation region. A contact plug 120, which is electrically connected to the source/drain diffusion layers 115, 116, and gate electrodes 107n, 107p, is embedded in the first interlayer insulation film 119. The contact plug 120, for example, utilizes a barrier metal comprising titanium (Ti) and titanium nitride (TiN), and a tungsten plug constituted by stacking tungsten layers.

The source/drain diffusion layers 115, 116, and a wiring layer 121, which is electrically connected to the gate electrodes 107n, 107p, are formed with the contact plug 120 interposed, on the first interlayer insulation film 119 implanted. The wiring layer 121, for example, uses aluminum (Al) as the material. A second interlayer insulation film 122 is additionally formed on the first interlayer insulation film 119 so as to cover the wiring layer 121.

Next, manufacturing processes of the semiconductor device described hereinabove will be explained using FIG. 2A through 2E. FIGS. 2A through 2E are cross-sectional views illustrating manufacturing processes of a semiconductor device related to the first embodiment of the present invention.

Firstly, as shown in FIG. 2A, element-separating insulation films 101a through 101c are formed using STI (shallow trench isolation) technology in regions other than the element formation regions on a silicon substrate 100, which has the crystalline structure of a single crystal. Next, a resist, which is not shown in the figure, is selectively formed on the silicon substrate 100 in regions other than the region in which the N-type MOSFET is to be formed. Using this resist as a mask, for example, $B^+$ ions are implanted in the region of the silicon substrate 100 where the N-type MOSFET will be formed, after which, the resist is removed via ashing. Next, a resist not shown in the figure, is selectively formed on the silicon substrate 100 in regions other than the region in which the P-type MOSFET is to be formed. Using this resist as a mask, $As^+$ ions, for example, are implanted in the region of the silicon substrate 100 where the P-type MOSFET will be formed, after which, the resist is removed via ashing. Then, by subjecting the silicon substrate 100, in which impurities have been doped by means of ion implantation, to high-temperature heat treatment, the p-well 102 and the n-well 103, which are deep diffusion layers, are formed.

Next, a thin gate insulation film 104, such as a silicon oxide layer; is formed on the surface of the silicon substrate 100, for example, by thermal oxidation. Then, a 50 nm-thick tungsten layer 105, having a work function of 4.9 eV, is deposited on the gate insulation film 104 by chemical vapor deposition (hereinafter, referred to as CVD) using an organic material as a source. In addition, a 50 nm-thick silicon nitride layer 106, for example, is deposited on the tungsten layer 105 by CVD.

Next, a resist not shown in the figure is selectively formed on the silicon nitride layer 106 only in the regions where the gate electrodes of an N-type MOSFET and a P-type MOSFET are to be formed. Then, after performing anisotropic etching of the silicon nitride layer 106 using the resist as a mask, the resist is removed by carrying out ashing. In addition, the tungsten layer 105 is subjected to anisotropic etching by using as a mask the silicon nitride layer 106, which has been selectively left only in the regions where the gate electrodes are to be formed, and, as shown in FIG. 2B; for example, gate electrodes 107n and 107p, which have gate lengths of 30 nm, are formed. Then, a resist not shown in the figure is selectively formed on the gate insulation film 104 of the P-type MOSPET, and using as masks this resist and the silicon nitride layer 106 on the gate electrode 107n, $As^+$ ions, for example, are implanted inside the silicon substrate 100 of the N-type MOSFET region. Subsequent to removing the resist by ashing, a resist not shown in the figure is selectively formed on the gate insulation film 104 of the N-type MOSFET region, and using as masks this resist and the silicon nitride layer 106 on the gate electrode 107p, $B^+$ ions, for example, are implanted inside the silicon substrate 100 of the P-type MOSFET region. In addition, the gate insulation film 104 and resist are removed from regions other than the regions of the gate electrodes 107n, 107p by ashing, and then the silicon substrate 100 is subjected to heat treatment for five seconds at a temperature, for example, of 800° C. to form shallow diffusion layers 108 and 109 in the silicon substrate 100.

Next, as shown in FIG. 2C, a silicon nitride layer 110 and a silicon oxide layer 111 are deposited, in that order, over the entire surface of the silicon substrate 100 using, for example, CVD, and thereafter, the silicon nitride layer 110 and a silicon oxide layer 111 are etched back over the entire surface until the silicon substrate 100 is exposed, and a gate-sidewall insulation film 112 comprising the silicon nitride layer 110 and a silicon oxide layer 111 is formed on both the sidewalls of the respective gate electrodes 107n, 107p. Then, a resist not shown in the figure is selectively formed on the silicon substrate 100 of the P-type MOSFET region, and using as masks the resist, the silicon nitride layer 106 on the gate electrode 107n, and the gate-sidewall insulation film 112, $P^+$ ions, for example, are implanted inside the silicon substrate 100 of the N-type MOSFET region. After removing the resist by performing ashing, a resist not shown in the figure is selectively formed on the silicon substrate 100 of the N-type MOSFET region, and using as masks the resist, the silicon nitride layer 106 on the gate electrode 107p, and the gate-sidewall insulation film 112, $B^+$ ions, for example, are implanted inside the silicon substrate 100 of the P-type MOSFET region. In addition, after removing the resist via ashing, for example, by subjecting the silicon substrate 100 to heat treatment at a temperature of 1030° C., deep diffusion layers 113 and 114 are formed in the silicon substrate 100.

As described hereinabove, source/drain diffusion layers 115 and 116, which comprise respectively shallow diffusion layers 108, 109, and respectively deep diffusion layers 113, 114, are formed in the silicon substrate 100 at both sides of the respective gate electrodes 107n, 107p.

Then, for example, a roughly 10 nm nickel layer not shown in the figure is deposited over the entire surface of the silicon substrate 100, after which the silicon substrate having the nickel layer deposited is subjected to heat treatment for 30 seconds at a temperature of 350° C. to make the nickel layer chemically react with the silicon substrate 100. Next, after selectively removing the silicon substrate 100 and unreacted nickel layer by wet etching using, for example, a mixed solution of sulfuric acid and oxygenated water, heat treatment is performed for 30 seconds at 500° C. This forms a nickel silicide layer 117 on the surface of the source/drain diffusion layers 115, 116.

Next, as shown in FIG. 2D, for example, a plasma CVD method is used, and an approximately 200 nm-thick silicon nitride layer comprising between $1E21 \text{ cm}^{-3}$ to $1E22 \text{ cm}^{-3}$ of hydrogen is deposited over the entire surface of the silicon substrate 100 in a mixed gas environment of silane and ammonia. Next, a resist not shown in the figure is selectively formed on the silicon nitride layer of the N-type MOSFET region, and the silicon nitride layer is subjected to anisotropic etching using the resist as a mask. Next, by removing the resist by ashing, a passivation layer 118 is formed on the surface of the silicon substrate 100 of the N-type MOSFET region, the silicon nitride layer 106 on the gate electrode 107n, and the gate-sidewall insulation film 112 covering the gate electrode 107n. In addition, heat treatment is performed in a non-oxidizing environment, such as a nitrogen environment, for between 30 minutes and one hour at temperatures, for example, between 350° C. and 500° C.

Figure 3:
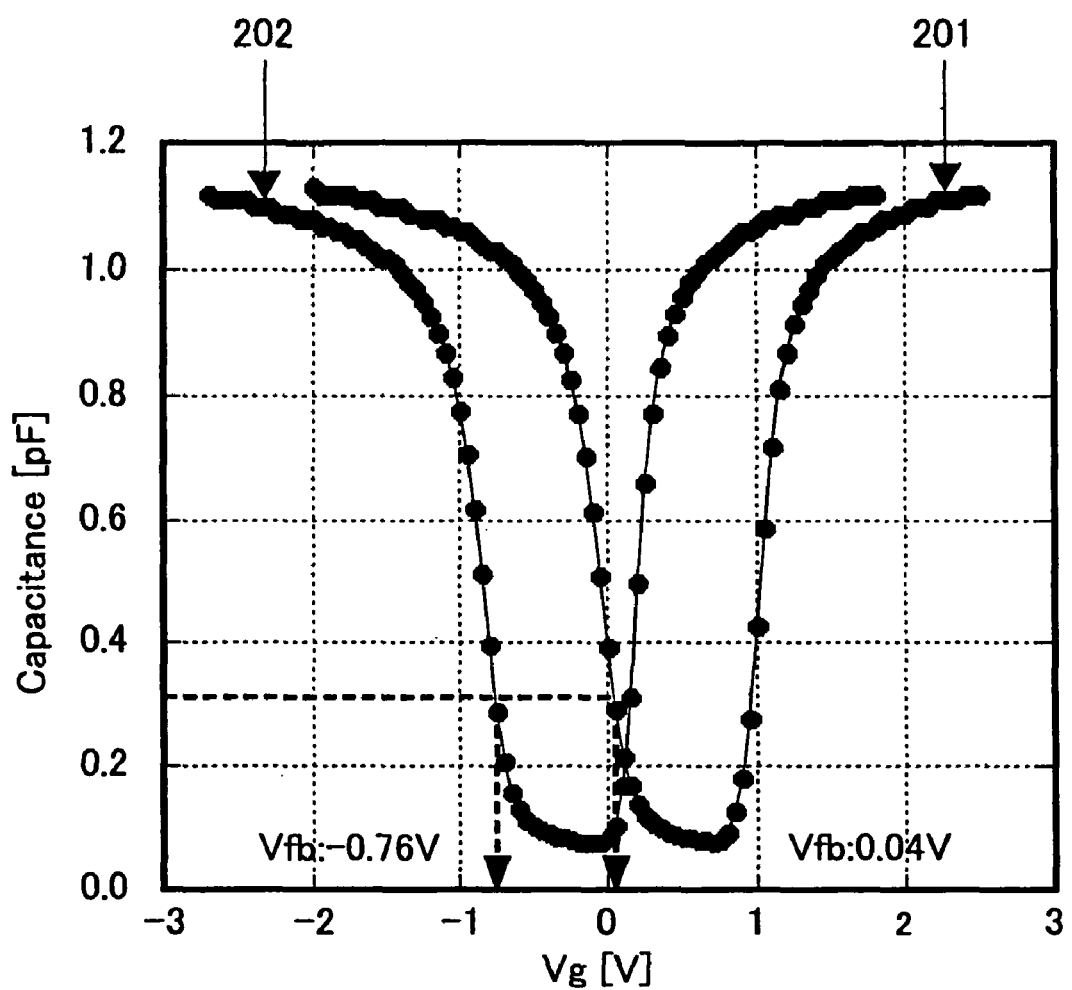
FIG. 3 is a C-V characteristic diagram showing the results of measuring the voltage dependence of the capacitance of a transistor, which uses tungsten in the gate electrode.

Here, the work function of the N-type MOSFET gate electrode 107n, and the work function of the P-type MOSFET gate electrode 107p after heat treatment will be explained using FIG. 3. FIG. 3 is a C-V characteristic diagram showing the results of measuring the voltage dependence of the capacitance of a transistor, which uses tungsten in the gate electrode. FIG. 3 shows a C-V curve 201 of a transistor, which has been subjected to heat treatment without covering the periphery of a gate electrode with a silicon nitride layer containing hydrogen, and shows a C-V curve 202 of a transistor, which has been subjected to heat treatment after the periphery of a gate electrode covering with a silicon nitride layer containing around 1E21 cm$^{-3}$ of hydrogen. The C-V curve 201 corresponds to the C-V characteristics of the P-type MOSFET in this embodiment, and C-V curve 202 corresponds to the C-V characteristics of the N-type MOSFET in this embodiment. In FIG. 3, the flat-band voltage Vfb of these C-V curves 201, 202 is +0.04V and −0.76V, respectively.

That is, performing heat treatment after covering the periphery of a gate electrode with a silicon nitride layer containing hydrogen causes the value of the Vfb to shift approximately −0.80V. This Vfb shift is believed to be caused by that the heat treatment combines the carbon contained inside the tungsten layer of the gate electrode with the large amount of hydrogen contained inside the silicon nitride layer, forms a chemical compound such as either $CH_4$ or $C_2H_2$, and eliminates the compound. That is, in the electrode whose periphery is covered by the oxygen-containing silicon nitride layer, heat treatment can be said to reduce the concentration of carbon in the phase boundary with the gate insulation film, causing the Vfb to shift approximately −0.80V. Furthermore, this same effect is achieved if the hydrogen concentration inside the silicon nitride layer is not less than 1E21 cm$^{-3}$.

The value of the flat-band voltage Vfb is a value that corresponds to the work function of a gate electrode, and the gate electrode work function determined from the Vfb value of C-V curve 201 is 4.9 eV, and the gate electrode work function determined from the Vfb value of C-V curve 202 is 4.1 eV. This means the work function of the P-type MOSFET gate electrode 107p in the first embodiment is 4.9 eV, and the work function of the N-type MOSFET gate electrode 107n in the first embodiment is 4.1 eV. In other words, according to the present invention, it is possible to endow the gate electrodes 107n, 107p with different work functions without using different electrode materials in each one.

After making the work functions of the gate electrodes 107n, 107p different by performing heat treatment as described hereinabove, for example, as shown in FIG. 2E, CVD is used to deposit a first interlayer insulation film 119 on the surface of the silicon substrate 100 of the P-type MOSFET formation region, the gate electrode 107p, the gate-sidewall insulation film 112 covering the gate electrode 107p, and the passivation layer 118 formed in the N-type MOSFET formation region, and the surface is planarized using chemical-mechanical polishing (hereinafter, referred to as CMP). Next, the first interlayer insulation film 119 covering the top surface of the nickel silicide layer 117 on the source/drain diffusion layers 115, 116, and the first interlayer insulation film 119 and silicon nitride layer 106 covering the top surface of the silicon nitride layer 106 on the gate electrodes 107n, 107p are removed by anisotropic etching, and a contact pattern is formed. That is, the first interlayer insulation film 119 and silicon nitride layer 106 are subjected to anisotropic etching so as to expose from the bottom of the contact pattern the nickel silicide layer 117 on the source/drain diffusion layers 115, 116, and the tungsten gate electrodes 107n, 107p.

Then, for example, titanium, titanium nitride, and tungsten layers are deposited in that order inside the contact pattern using the sputtering method. Next, CMP is used to planarize the surface of the first interlayer insulation film 119, and a contact pattern, inside which contact plugs 120 are embedded, is formed. Next, for example, aluminum is deposited on the first interlayer insulation film 119 using the sputtering melted, patterning is carried out in the desired shape using photolithography and dry etching, and a wiring layer 121 is formed. The wiring layer 121 is formed so as to be connected electrically to either the source/drain diffusion layers 115, 116, or the gate electrodes 107n, 107p via the contact plugs 120. Finally, a second interlayer insulation film 122 is deposited, for example, using CVD, on the first interlayer insulation film 119 so as to cover the wiring layers 120, 121, and the surface is planarized using CMP. By doing so, the semiconductor device shown in FIG. 1, comprising an N-type MOSFET made from a tungsten electrode with a work function of 4.1 eV, and a P-type MOSFET made from a tungsten electrode with a work function of 4.9 eV, is completed.

Thus, in the first embodiment, because the same metal material is used in the P-type MOSFET gate electrode 107p and the N-type MOSFET gate electrode 107n, and their respective work functions are differentiated by changing the concentrations of carbon contained in the gate electrodes 107p, 107n, it is possible to form metal gate electrodes having different work functions for the P-type MOSFET and the N-type MOSFET without significantly increasing the number of manufacturing processes.

Furthermore, in the first embodiment, tungsten is used as the material of the gate electrodes 107n, 107p, but this material can be any metal material with a work function of 4.8 eV or greater, for example, palladium (Pd), nickel (Ni), cobalt (Co), rhodium (Rh), iridium (Ir), molybdenum antimony (Sb), bismuth (Bi), or can be an alloy of these.

Also, the gate insulation film 104 does not have to be a silicon oxide layer resulting from thermal oxidation, and any insulation film having a dielectric constant that is higher than the silicon oxide layer can be used, for example, an oxide of hafnium (Hf), zirconium (Zr), titanium (Ti), tantalum (Ta), aluminum (Al), strontium (Sr), yttrium (Y), lanthanum (La), or an compound oxide of any of these elements and a silicon, such as ZrSixOy. In addition, stacked layers of these oxides can also be used.

Further, the passivation layer 118 is formed after forming the gate-sidewall insulation film 112 and nickel silicide layer 117, but this passivation layer 118 can also be formed prior to forming the gate-sidewall insulation film 112, that is, in the state shown in FIG. 2B. In order to prevent flocculation of the nickel silicide layer 117 when the passivation layer 118 is formed after forming the nickel silicide layer 117, a heat treatment for eliminating the carbon from the gate electrode 107n is carried out at temperatures of less than 500° C., but when the passivation layer 118 is formed prior to forming the gate-sidewall insulation film 112, this heat treatment can be carried out at a temperature of 500° C. or higher. Further, when the passivation layer 118 is formed prior to forming the gate-sidewall insulation film 112, it is necessary to remove the passivation layer 118 after heat treatment to enable the formation of the nickel silicide layer 117 in a subsequent process.

Second Embodiment

Figure 4:
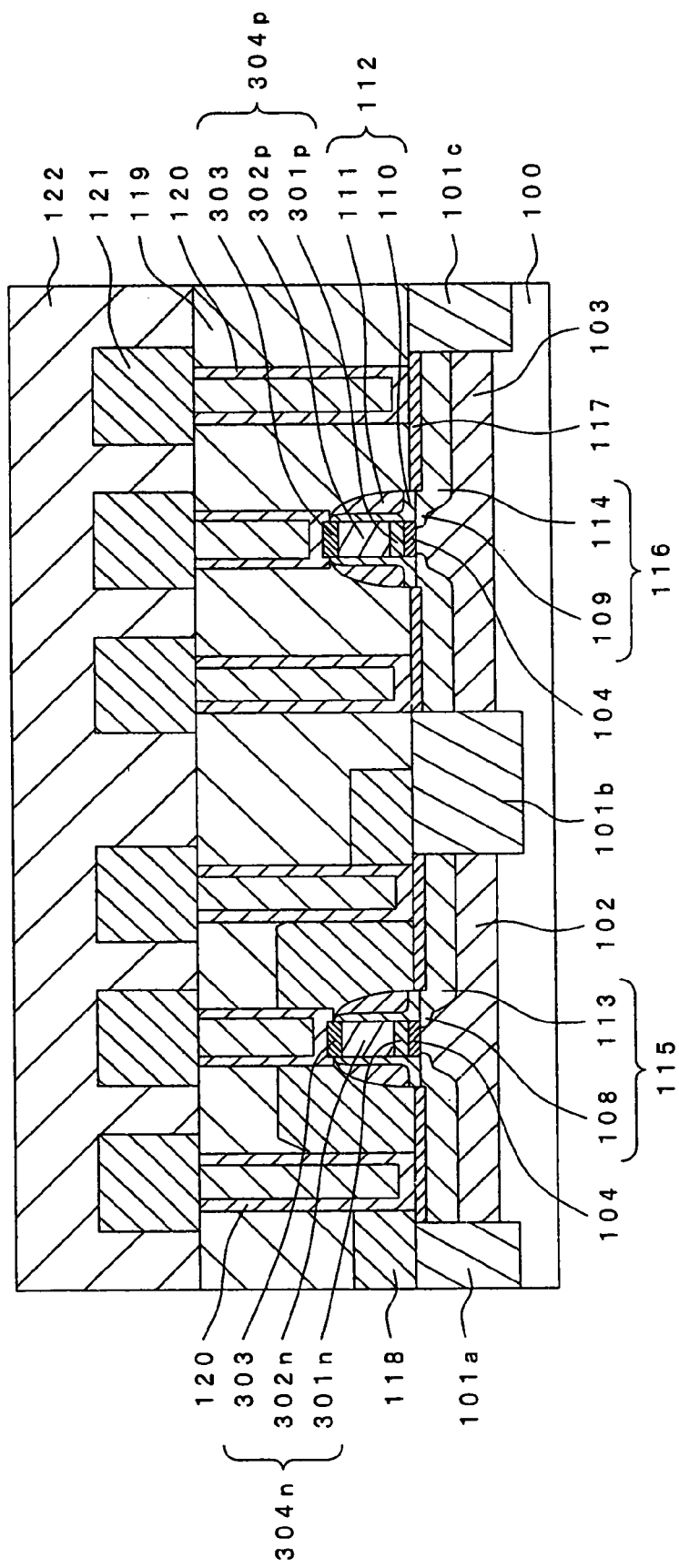
FIG. 4 is a simplified cross-sectional view illustrating a structure of a semiconductor device related to a second embodiment of the present invention.

The structure of a semiconductor device in a second embodiment of the present invention will be explained using FIG. 4. FIG. 4 is a simplified cross-sectional view illustrating a structure of a semiconductor device related to the second embodiment of the present invention. Since the structural components other than the gate electrodes 304n, 304p, are the same as those in the first embodiment, the structural components in FIG. 4 that are the same as those in FIG. 1 will be assigned the same reference numerals, and explanations thereof will be omitted.

In the first embodiment described hereinabove, the gate electrode 107 is formed using only a tungsten layer, but in the second embodiment, a gate electrode 304 is formed by stacking a tungsten layer 301 and a polysilicon layer 302 having on its surface a nickel silicide layer 303, which is one of the metal silicides. More specifically, an N-type MOSFET gate electrode 304n is formed by stacking a low-carbon-content tungsten layer 301n, and an n-type polysilicon layer 302n having on its surface a nickel silicide layer 303 and doped, for example, with phosphorous (P$^+$), and a P-type MOSFET gate electrode 304p is formed by stacking a high-carbon-content tungsten layer 301p, and a p-type polysilicon layer 302p having on its surface a nickel silicide layer 303 and doped, for example, with boron (B$^+$).

Stacking the gate electrodes 304n, 304p like this makes it possible to differentiate the respective work functions by adjusting the carbon content of the tungsten layers 301n, 301p, in the same way as in the first embodiment, and enables the resistance of the gate electrodes 304n, 304p to be lowered by virtue of the polysilicon layers 302n, 302p having a nickel silicide layer 303 on their surfaces.

Next, the manufacturing process for the above-mentioned semiconductor device will be explained using FIG. 5A through FIG. 5E. FIGS. 5A through 5E are cross-sectional views illustrating manufacturing processes of a semiconductor device related to the second embodiment of the present invention.

First, as shown in FIG. 5A, element-separating insulation films 101a through 101c are formed using STI in regions other than the element formation regions on the silicon substrate 100. Next, a p-well 102 and an n-well 103 are formed in the regions of the silicon substrate 100 where an N-type MOSFET and a P-type MOSFET are to be formed. In addition, a gate insulation film 104 is formed on the surface of the silicon substrate 100.

Then, a 10 nm-thick tungsten layer 301, having a work function of 4.9 eV, is deposited on the gate insulation film 104 by CVD using an organic material as a source. A 90 nm polysilicon layer 302 is deposited, for example, using CVD on the tungsten layer 301. Next, a resist not shown in the figure is selectively formed of the polysilicon layer 302 in the P-type MOSFET region, and, using this resist as a mask, for example, P$^+$ ions are implanted inside the polysilicon layer 302 of the N-type MOSFET region. After removing the resist by ashing, a resist not shown in the figure is selectively formed on the polysilicon layer 302 in the N-type MOSFET region, and, using this resist as a mask, for example, B$^+$ ions are implanted inside the polysilicon layer 302 in the P-type MOSFET region. Additionally, after removing the resist by ashing, a 50 nm-thick silicon nitride layer 305 is deposited using, for example, CVD.

Next, as shown in FIG. 5B, a resist not shown in the figure is selectively formed on the silicon nitride layer 305 only in the regions where gate electrodes of an N-type MOSFET and a P-type MOSFET are to be formed. Then, using the resist as a mask, the silicon nitride layer 305 is subjected to anisotropic etching, after which the resist is removed by ashing. In addition, using the silicon nitride layer 305, which has been selectively left only in the regions where the gate electrodes will be formed, as a mask, the polysilicon layer 302 and tungsten layer 301 are subjected to anisotropic etching, after which the silicon nitride layer 305 is removed, forming gate electrodes 304n and 304p.

Then, a resist not shown in the figure is formed on the gate insulation film 104 on the P-type MOSFET region, and, using this resist and the gate electrode 304n as masks, As$^+$ ions, for example, are implanted inside the silicon substrate 100 of the N-type MOSFET region. After removing the resist via ashing, a resist not shown in the figure is selectively formed on the gate insulation film 104 of the N-type MOSFET region, and, using this resist and the gate electrode 304p as masks, ions, for example, are implanted inside the silicon substrate 100 of the P-type MOSFET region. Additionally, the resist is removed by ashing, and then the silicon substrate 100 is subjected to heat treatment for five seconds at a temperature, for example, of 800° C. to form shallow diffusion layers 108 and 109 inside the silicon substrate 100.

Next, as shown in FIG. 5C, a gate-sidewall insulation film 112, which comprises a silicon nitride layer 110 and a silicon oxide layer 111, is formed on the respective sidewalls of the gate electrodes 304n, 304p. Further, source/drain diffusion layers 115, 116 are formed respectively inside the silicon substrate 100 at both sides of the respective gate electrodes 304n, 304p. The source/drain diffusion layers 115, 116 are formed from shallow diffusion layers 108, 109 and deep diffusion layers 113, 114. The specific method for forming the gate-sidewall insulation film 112 and deep diffusion layers 113, 114 is the same as that of the first embodiment, which was explained using FIG. 2C.

Next, for example, after depositing an approximately 10 nm nickel layer not shown in the figure over the entire surface of the silicon substrate 100 and polysilicon layers 302n, 302p, heat treatment is applied for 30 seconds at a temperature of 350° C., causing the nickel layer and the silicon substrate 100 to react chemically. Next, the silicon substrate 100 and unreacted nickel layer are selectively removed by wet etching using, for example, a mixed solution of sulfuric acid and oxygenated water, after which heat treatment is performed for 30 seconds at 500° C. This forms nickel silicide layers 117 and 303 in a self-aligning condition on the surfaces of the source/drain diffusion layers 115, 116, and the polysilicon layers 302n, 302p.

Next, as shown in FIG. 5D, a passivation layer 118 containing hydrogen is formed the surface on the gate-sidewall insulation film 112, which is covering the silicon substrate 100 on the N-type MOSFET formation region, gate electrode 304n, and gate electrode 304p, and carbon is eliminated from the tungsten layer 301n, which constitutes the gate electrode 304n, by applying heat treatment in a non-oxidizing environment, such as a nitrogen environment, for between 30 minutes and one hour at temperatures, for example, between 350 and 500° C. This lowers the work function of the gate electrode 304n from 4.9 eV to 4.1 eV. The specific methods for forming the passivation layer 118 is the same as that of the first embodiment, which was explained using FIG. 2D.

Finally, as shown in FIG. 5E, a first interlayer insulation film 119, a contact plug 120, a wiring layer 121, and a second interlayer insulation film 122 are formed the same as in the first embodiment, which was explained using FIG. 2E, and the semiconductor device shown in FIG. 4 is completed.

Thus, in the second embodiment, the same metal material, for example, tungsten, is used in the P-type MOSFET gate electrode 304p and the N-type MOSFET gate electrode 304n, and the gate electrodes 304n, 304p use a stacked structure of a tungsten layer 301, and a polysilicon layer 302 having a nickel silicide layer 303 on its surface. This makes it possible to differentiate the respective work functions by adjusting the carbon content of the tungsten layers 301n, 301p without significantly increasing the number of manufacturing processes, in the same way as in the first embodiment, and, in addition, it makes it possible to lower the resistance of the gate electrodes 304n, 304p owing to the polysilicon layers 302n, 302p having a nickel silicide layer 303 on their surfaces.

Furthermore, in the second embodiment, in the same way as in the first embodiment, the material for the gate electrodes 304n, 304p can be a metal other than tungsten, or can be an alloy as long as the work function of the metal material is 4.8 eV or greater. Also, the gate insulation film 104 can make use of any insulation film having a dielectric constant that is higher than the silicon oxide layer. Further, the passivation layer 118 can also be formed prior to the gate-sidewall insulation film 112, that is, it can be formed in the state shown in FIG. 5B, and in this case, a heat treatment for eliminating carbon can be carried out at a temperature of 500° C. or higher.

Third Embodiment

Figure 6:
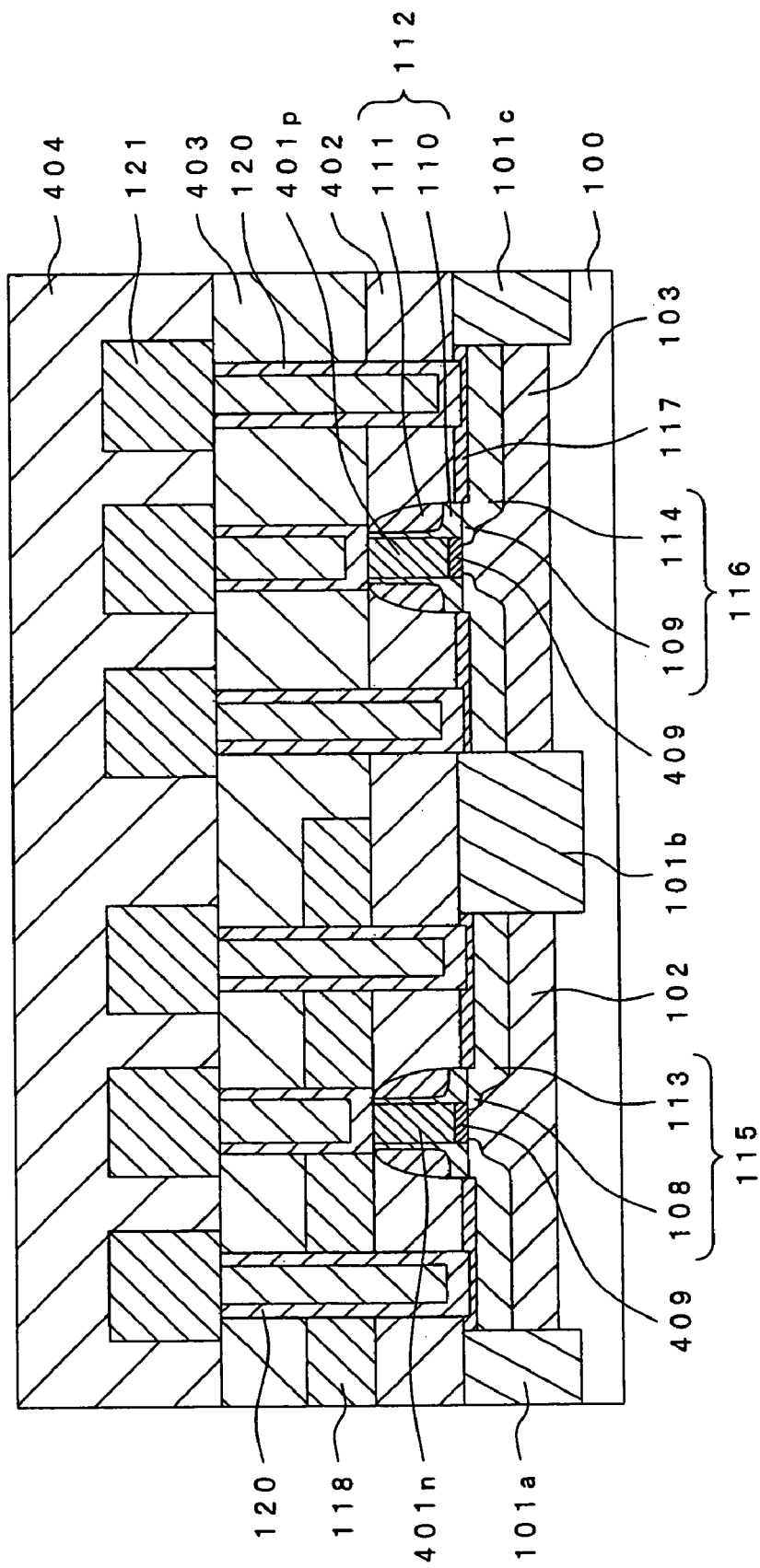
FIG. 6 is a simplified cross-sectional view illustrating a structure of a semiconductor device related to a third embodiment of the present invention.

The structure of a semiconductor device in a third embodiment of the present invention will be explained using FIG. 6. FIG. 6 is a simplified cross-sectional view illustrating a structure of a semiconductor device related to the third embodiment of the present invention. Since the structural elements other than the gate electrodes 401n, 401p, and the interlayer insulation films 402, 403, 404, for insulating the wiring layers 121, the N-type MOSFET and P-type MOSFET are the same as those in the first embodiment, the structural components in FIG. 6 that are the same as those in FIG. 1 will be assigned the same reference numerals, and explanations thereof will be omitted.

In the first embodiment described hereinabove, the passivation layer 118 is formed so as to cover the surfaces of the gate electrode 107 and the gate-sidewall insulation film 112, but in the third embodiment, the structure is constituted such that a passivation layer 118 is formed on a first interlayer insulation film 402, which is formed up to the same height as the gate electrodes 401n, 401p on the silicon substrate 100, and the passivation layer 118 makes direct contact with the upper surface of the gate electrode 401n. Further, a second interlayer insulation film 403 is formed so as to cover the passivation layer 118, and, in addition, a third interlayer insulation film 404 is formed so as to cover a wiring layer 121 formed on the surface of the second interlayer insulation film 403. That is, the first and second interlayer insulation films 402, 403, in the third embodiment correspond to the first interlayer insulation film 119 in the first embodiment, and the third interlayer insulation film 404 in the third embodiment corresponds to the second interlayer insulation film 122 in the first embodiment.

Next, the manufacturing process of the above-mentioned semiconductor device will be explained using FIG. 7A through FIG. 7G. FIGS. 7A through 7G are cross-sectional views illustrating manufacturing processes of the semiconductor device related to the third embodiment of the present invention.

Figures 7A, 7B, 7C:
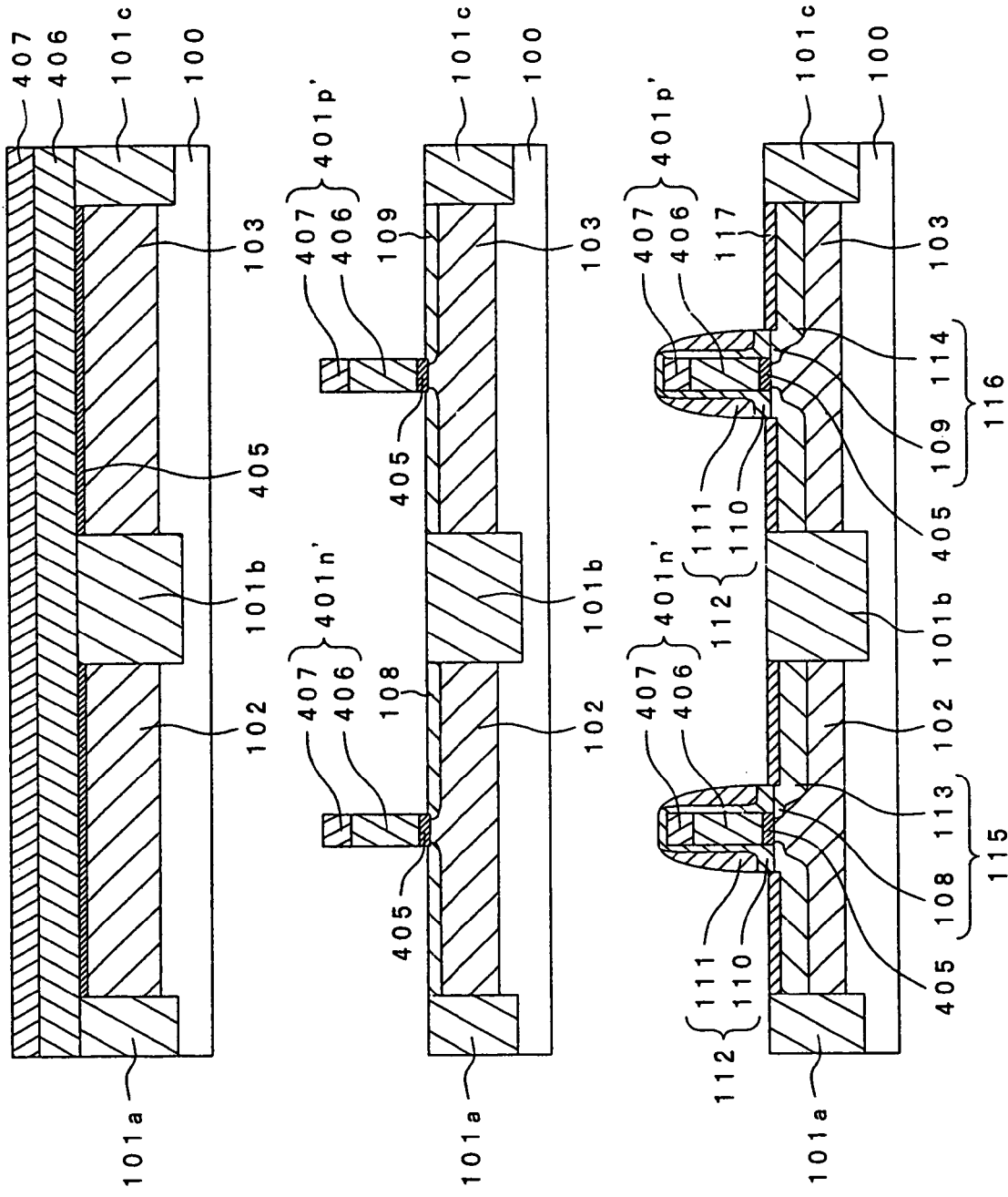

First, as shown in FIG. 7A, element-separating insulation films 101a through 101c are formed using STI technology in regions other than the element formation regions on the silicon substrate 100. Then, a p-well 102 and an n-well 103 are formed in the regions of the silicon substrate 100, where the N-type MOSFET and P-type MOSFET are to be formed.

Next, a silicon oxide layer 405 is formed on the surface of the silicon substrate 100 using, for example, thermal oxidation. In addition, a 100 nm-thick polysilicon layer 406 is deposited on the silicon oxide layer 405 using, for example, CVD, and a 100 nm-thick silicon nitride layer 407 is deposited further on the polysilicon layer 406 using, for example, CVD.

Next, as shown in FIG. 7B, a resist not shown in the figures is selectively formed on the silicon nitride layer 407 only in the regions, where the N-type MOSFET and P-type MOSFET gate electrodes are to be formed. Then, using the resist as a mask, the silicon nitride layer 407 is subjected to anisotropic etching, after which the resist is removed by ashing. In addition, using as a mask the silicon nitride layer 407, which has been selectively left only in the regions where the gate electrode are to be formed, the polysilicon layer 406 is subjected to anisotropic etching, and dummy gate electrodes 401n' and 401p' are formed.

Then, a resist not shown in the figure is selectively formed on the silicon oxide layer 405 on the P-type MOSFET region, and, using this resist and dummy gate electrode 401n' as masks, for example, As+ ions are implanted inside the N-type MOSFET region of the silicon substrate 100. After removing the resist by ashing, a resist not shown in the figure is selectively formed on the silicon oxide layer 405 on the N-type MOSFET region, and, using this resist and dummy gate electrode 401p' as masks, B+ ions, for example, are implanted inside the P-type MOSFET region of the silicon substrate 100. In addition, after removing the resists by asking, shallow diffusion layers 108 and 109 are formed inside the silicon substrate 100 by performing heat treatment for five seconds at a temperature, for example, of 800° C.

Next, as shown in FIG. 7C, a gate-sidewall insulation film 112, which comprises a silicon nitride layer 110 and a silicon oxide layer 111, is formed on both the sidewalls of the respective dummy gate electrodes 401n', 401p'. Further, source/drain diffusion layers 115, 116 are respectively formed inside the silicon substrate 100 at both sides of the respective dummy gate electrodes 401n', 401p'. The source/drain diffusion layers 115, 116 are formed from shallow diffusion layers 108, 109 and deep diffusion layers 113, 114. In addition, a nickel silicide layer 117 is formed on the surface of the source/drain diffusion layers 115, 116. The specific methods for forming the gate-sidewall insulation film 112, deep diffusion layers 113, 114, and nickel silicide layer 117 are the same as those of the first embodiment, which has been explained using FIG. 2C.

Next, as shown in FIG. 7D, a first interlayer insulation film 402 is deposited over the entire surface of the silicon substrate 100 using, for example, CVD. Then, using, for example, CMP, the first interlayer insulation film 402 is polished until the surface of the polysilicon layer 406 is exposed, and the surface of the first interlayer insulation film 402 is planarized.

Next, the polysilicon layer 406 is stripped, and cavity portions 408 are formed in the parts where the dummy gate electrodes 401n', 401p' have been formed. In addition, the silicon oxide layer 405, which has been formed at each bottom of the dummy gate electrodes 401n', 401p' is also stripped. Next, a resist not shown in the figure is selectively formed on the P-type MOSFET region of the silicon substrate 100 and the first interlayer insulation film 402, and, using this resist and the first interlayer insulation film 402 as masks, In+ ions, for example, are implanted inside the silicon substrate 100 at the bottom of the N-type MOSFET region cavity portion 408. Then, after removing the resist by ashing, the impurity concentration of the N-type MOSFET channel region is adjusted by performing heat treatment for a short time at, for example, 1000° C., adjusting the threshold voltage of the N-type MOSFET. In addition, an ultra-thin gate insulating film 409 is formed on the silicon substrate 100 at the bottom of the cavity portion 408 using, for example, plasma oxidation and nitriding.

Next, as shown in FIG. 7E, a 150 nm-thick tungsten layer 401, having a work function of 4.9 eV, is deposited on the gate insulation film 409 by CVD using an organic material as a source. Then, the tungsten layer 401 is polished, using, for example, CMP, until the surface of the first interlayer insulation film 402 is exposed to form gate electrodes 401n and 401p.

Figure 7F:
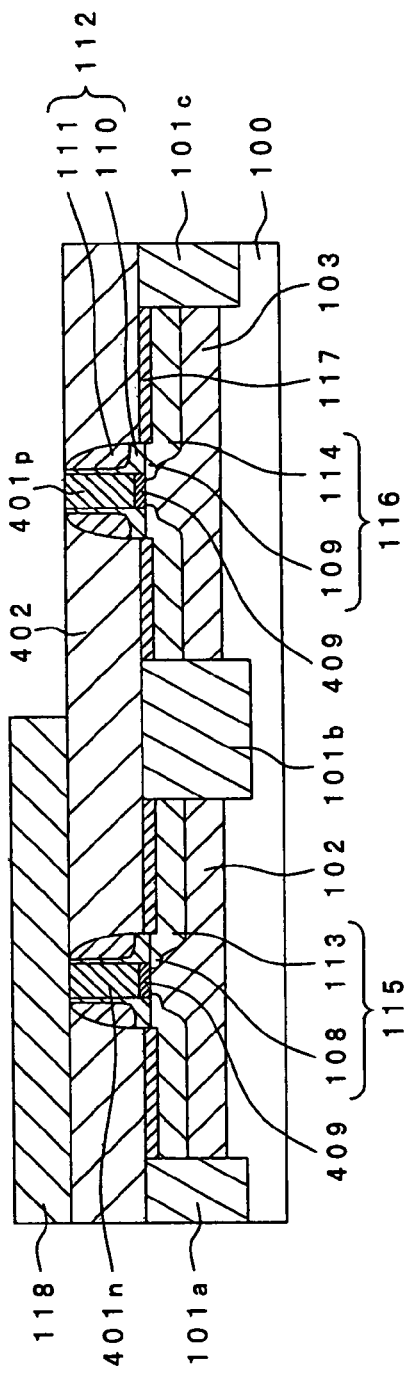

Next, as shown in FIG. 7F, a hydrogen-containing passivation layer 118 is formed on the surface of the first interlayer insulation film 402 and gate electrode 401n of the N-type MOSFET formation region, and carbon is eliminated from the tungsten layer 401n, which constitutes the gate electrode 401n, by subjecting the passivation layer 118 to heat treatment in a non-oxidizing environment, such as a nitrogen environment, for between 30 minutes and one hour at temperatures, for example, ranging from around 350° C. to 500° C. This lowers the work function of the gate electrode 401n from 4.9 eV to 4.1 eV. The specific formation method of the passivation layer 118 is the same as that of the first embodiment, which has been explained using FIG. 2D.

Figure 7G:
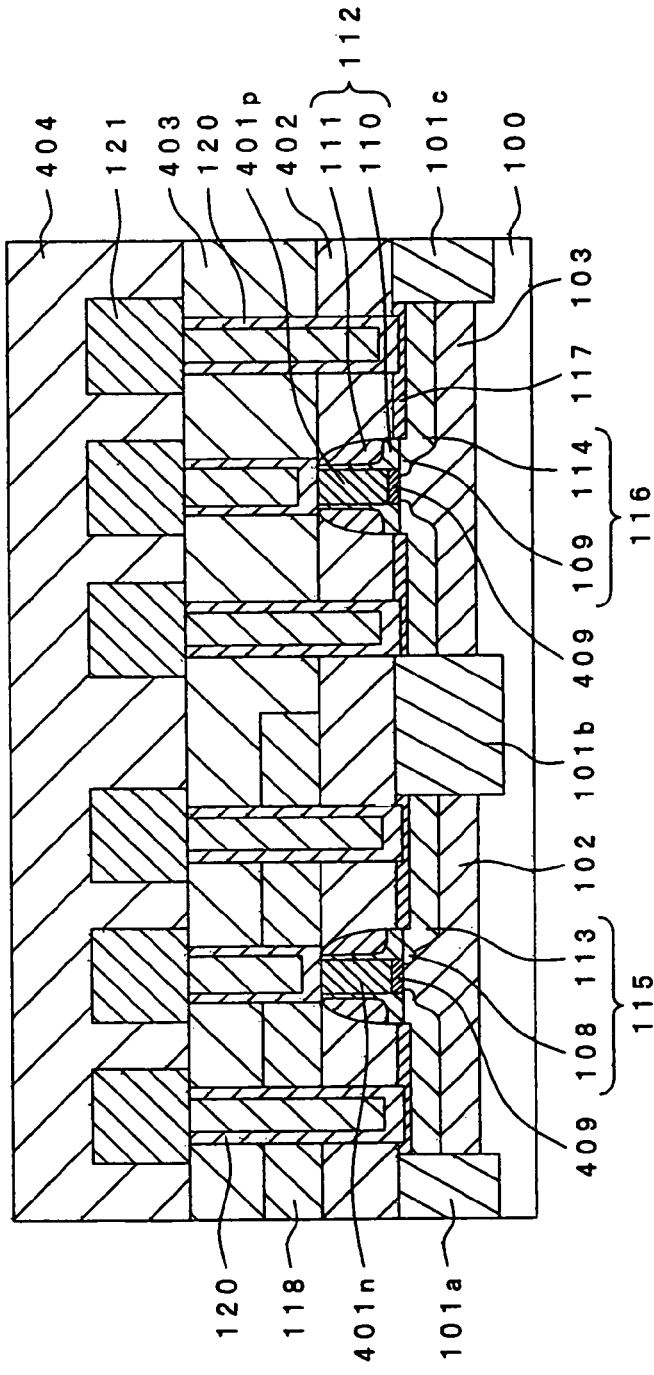

Next, as shown in FIG. 7G, a second interlayer insulation film 403 is deposited on the surfaces of the passivation layer 118 and the first interlayer insulation film 402 of P-type MOSFET formation region using, for example, CVD, and is planarized by CMP. Next, a contact plug 120 and wiring layer 121 are formed in the same way as in the first embodiment, which has been explained using FIG. 2D. Finally, a third interlayer insulation film 404 is formed on the second interlayer insulation film 403 using, for example, CVD, so as to cover the wiring layer 121, and is planarized by CMP, thereby completing the semiconductor device shown in FIG. 6.

Thus, in the third embodiment, because the same metal material, for example, tungsten, is used in the P-type MOSFET gate electrode 401p and the N-type MOSFET gate electrode 401n, and the respective work functions are differentiated by changing the concentration of carbon contained in the gate electrodes 401p, 401n, it is possible to form metal gate electrodes having different work functions for the P-type MOSFET and the N-type MOSFET without significantly increasing the number of manufacturing processes, in the same way as in the first embodiment.

Furthermore, in the third embodiment, in the same way as in the other embodiments; the material used in the gate electrodes 401n, 401p can be a metal other than tungsten, or can be an alloy as long as the work function of the metal material is 4.8 eV or greater. Also; the gate insulation film 409 can make use of any insulation film having a dielectric constant that is higher than the silicon oxide layer.

Fourth Embodiment

Figure 8:
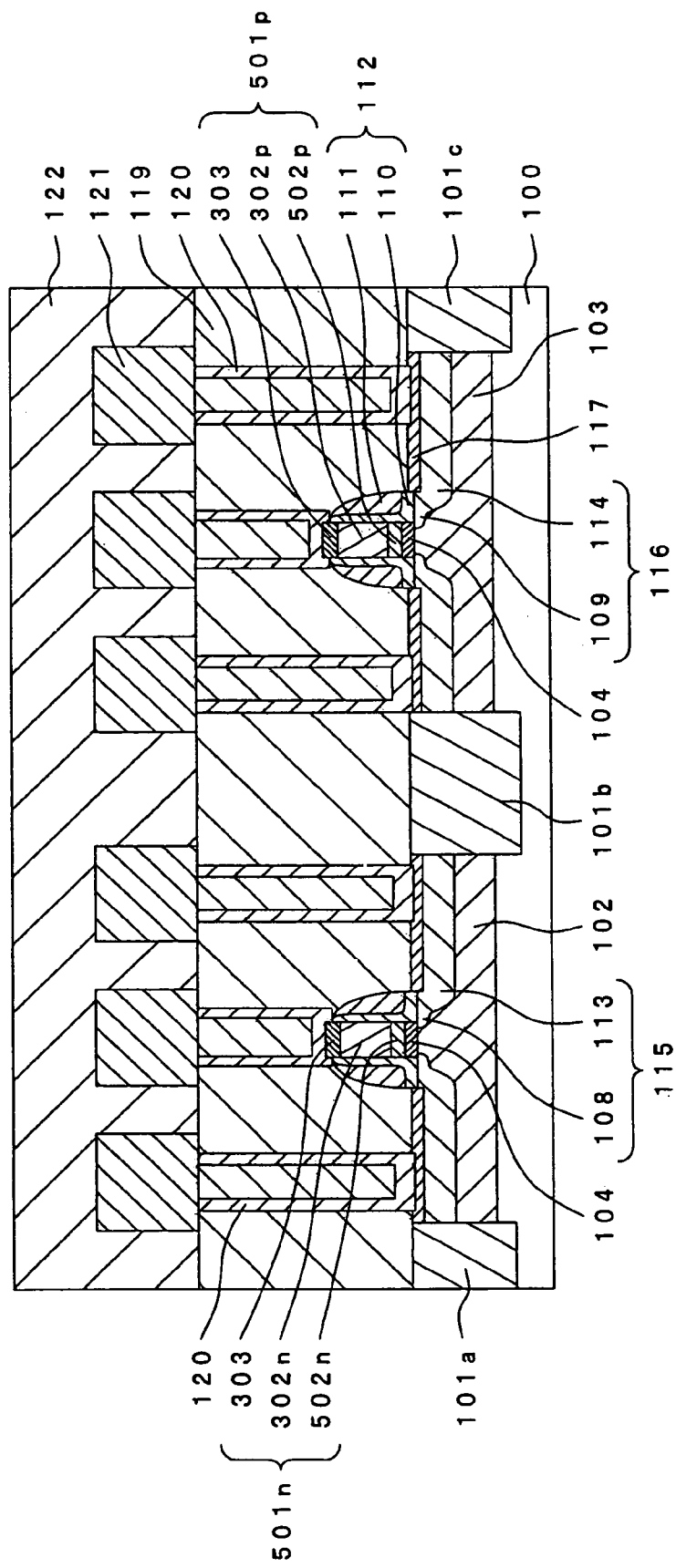
FIG. 8 is a simplified cross-sectional view illustrating a structure of a semiconductor device related to a fourth embodiment of the present invention.

The structure of a semiconductor device in a fourth embodiment of the present invention will be explained using FIG. 8. FIG. 8 is a simplified cross-sectional view illustrating a structure of a semiconductor device related to the fourth embodiment of the present invention. Since the structural components other than gate electrodes 501n and 501p are the same as those in the above-mentioned second embodiment, the structural components in FIG. 8 that are the same as those in FIG. 4 will be assigned the same reference numeral, and explanations thereof will be omitted.

In the above-mentioned second embodiment, the gate electrode 304 is formed by stacking the tungsten layer 301 and the polysilicon layer 302 having the nickel silicide layer 303 on its surface, but in the fourth embodiment, a gate electrode 501 is formed by stacking a molybdenum (Mo) layer 502 and a polysilicon layer 302 having a nickel silicide layer 303 on its surface. Further, in the fourth embodiment, since a passivation layer 503 is stripped during the fabrication process, both the N-type MOSFET and P-type MOSFET, the gate electrode 501, and the gate-sidewall insulation film 112 are directly covered by a first interlayer insulation film 119.

Next, the manufacturing process of the above-mentioned semiconductor device will be explained using FIG. 9A through 9E. FIGS. 9A, 9B, 9C, 9D and 9E are cross-sectional views illustrating the manufacturing processes of a semiconductor device related to the fourth embodiment of the present invention.

Figure 9A:
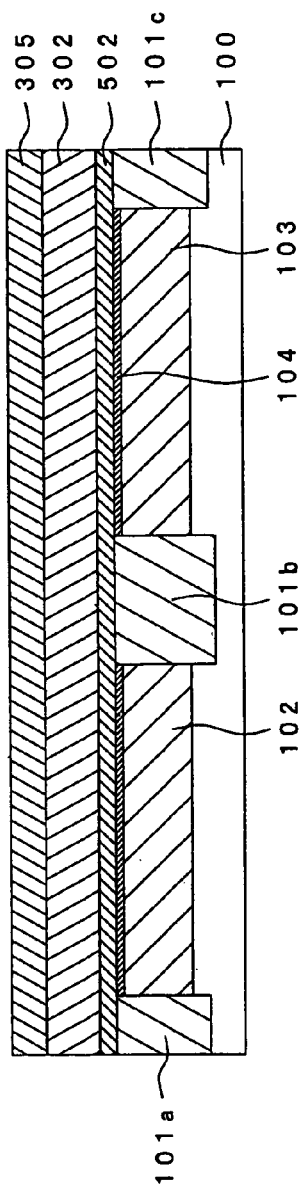

First, as shown in FIG. 9A, element-separating insulation films 101a through 101c are formed using STI technology in regions other than the element formation regions on the silicon substrate 100. Then, a p-well 102 and an n-well 103 are formed in the regions of the silicon substrate 100, where the N-type MOSFET and P-type MOSFET are to be formed. In addition, a gate insulation film 104 is formed on the surface of the silicon substrate 100.

Next, a 10 nm-thick molybdenum layer 502, which has a work function of 4.9 eV, is deposited on the gate insulation film 104, for example, by CVD, which makes use of an organic source. A 90 nm-thick polysilicon layer 302 is deposited on top of the tungsten layer 301, using, for example, CVD. Then, $P^+$ ions, for example, are implanted inside the polysilicon layer 302 in the P-type MOSFET region, and, $B^+$ ions, for example, are implanted inside the polysilicon layer 302 in the N-type MOSFET region, after which a 50 nm-thick silicon nitride layer 305 is deposited by, for example, CVD.

Figure 9B:
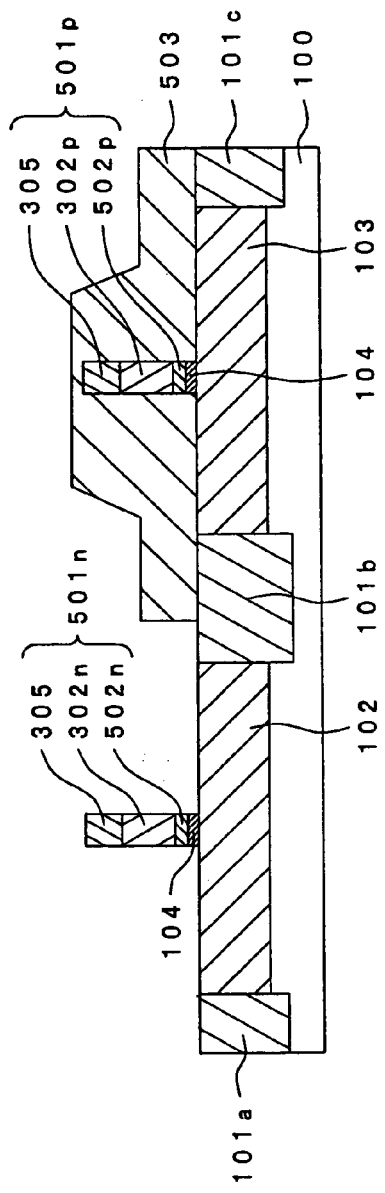

Next, as shown in FIG. 9B, a silicon nitride layer 305, polysilicon layer 302, and molybdenum layer 502 are subjected to anisotropic etching, thereby forming the gate electrodes 501n and 501p of the N-type MOSFET and P-type MOSFET, respectively.

Next, a silicon nitride layer is deposited over the entire surface of the silicon substrate 100 by, for example, CVD. Then, a resist not shown in the figure is selectively formed on the silicon nitride layer of the P-type MOSFET region, and, using this resist as a mask, the silicon nitride layer is subjected to anisotropic etching. Next, removing the resist by ashing forms a passivation layer 503 on the surface of the silicon substrate 100 of the P-type MOSFET formation region, the gate electrode 501p, and the gate-sidewall insulation film 112 covering the gate electrode 501p. In addition, heat treatment is performed for approximately 30 minutes at a temperature of, for example, about 600° C. to 900° C., in a mixed environment of an oxidizing environment such as steam and a reducing environment such as hydrogen. The ratio of partial pressure of the hydrogen and steam is set at, for example, nitrogen:hydrogen:steam=0.9951:0.040:0.009. That is, the partial pressure ratio of the reducing environment and the oxidizing environment for the heat treatment is not such that the molybdenum layer 502n itself of the gate electrode 501n is not oxidized but the carbon contained inside the molybdenum layer 502n is oxide. Furthermore, the temperature, and the partial pressure ratio of the reducing environment and oxidizing environment when heat treatment is being performed change in accordance with the type of metal constituting the gate electrodes 501n, 501p.

Furthermore, in the fourth embodiment, hydrogen and steam are selected as the combination for the reducing environment and the oxidizing environment, but carbon monoxide (CO) can be used as the reducing environment, and carbon dioxide ($CO_2$) can be used as the oxidizing environment.

The passivation layer 503 comprising a silicon nitride layer serves the role of preventing the hydrogen and steam from penetrated into the molybdenum layer 502p during the above-mentioned heat treatment. Accordingly, even when the above-mentioned heat treatment is carried out, the carbon content of the P-type MOSFET molybdenum layer 502p, which is covered by the passivation layer 503, is not changed, and the work function of the gate electrode 501p remains 4.9 eV. Conversely, during the above-mentioned heat treatment, the hydrogen and steam penetrate the N-type MOSFET molybdenum layer 502n, which is not covered by the passivation layer 503, and the carbon contained inside the molybdenum layer 502n combines with the steam to form carbon dioxide, and is eliminated. Thus, the concentration of carbon contained inside the molybdenum layer 502n is reduced, and the work function of the gate electrode 501n decreases from 4.9 eV to 4.1 eV.

Figure 9C:
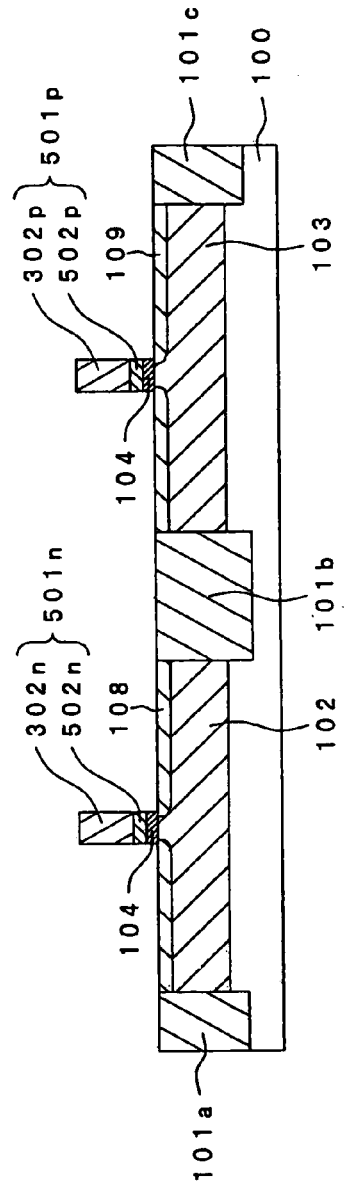

Next, as shown in FIG. 9C, the passivation layer 503, which is selectively formed on the P-type MOSFET region, is stripped. There is a possibility that the silicon nitride layer 305 of the gate electrodes 501n, 501p, which is the same material as the passivation layer 503, will also be stripped at this time, but it does not matter if it is stripped together with the passivation layer 503. Next, As$^+$ ions, for example, are implanted inside the silicon substrate 100 of the N-type MOSFET region, and, B$^+$ ions, for example, are implanted inside the silicon substrate 100 of the P-type MOSFET region, and shallow diffusion layers 108 and 109 are formed inside the silicon substrate 100 by applying heat treatment for five seconds, for example, at a temperature of 800° C.

Next, as shown in FIG. 9D, a gate-sidewall insulation film 112, which comprises a silicon nitride layer 110 and a silicon oxide layer 111, is formed on the respective sidewalls of the respective gate electrodes 501n, 501p. Further, source/drain diffusion layers 115, 116 are formed respectively inside the silicon substrate 100 at both sides the respective gate electrodes 501n, 501p. The source/drain diffusion layers 115, 116 are formed from shallow diffusion layers 108, 109 and deep diffusion layers 113, 114. Nickel silicide layers 117 and 303 are formed in a self-aligning condition on the surfaces of the source/drain diffusion layers 115, 116, and on the surfaces of the polysilicon layers 302n, 302p. The specific methods for forming the gate-sidewall insulation film 112, the deep diffusion layers 113, 114, and the nickel silicide layers 117, 303 are the same as those of the second embodiment, which has been explained using FIG. 5C.

Finally, as shown in FIG. 9E, a first interlayer insulation film 119, a contact plug 120, a wiring layer 121, and a second interlayer insulation film 122 are formed in the same way as in the second embodiment, which has been explained using FIG. 5E, and the semiconductor device shown in FIG. 8 is completed.

Thus, in the fourth embodiment, the same metal material, for example, molybdenum, is used in the P-type MOSFET gate electrode 501p and the N-type MOSFET gate electrode 501n, and the gate electrodes 501n, 501p use a stacked structure of a molybdenum layer 502, and a polysilicon layer 302 having a nickel silicide layer 303 on its surface. This makes it possible to differentiate the respective work functions by adjusting the amount of carbon contained in the molybdenum layers 502n, 502p without significantly increasing the number of manufacturing processes, in the same way as in the first embodiment, and, in addition, makes it possible to lower the resistance of the gate electrodes 501n, 501p owing to the polysilicon layers 302n, 302p having a nickel silicide layer 303 on their surfaces, in the same way as in the second embodiment.

Furthermore, in the fourth embodiment, in the same way as in the other embodiments, the material for the gate electrodes 501n, 501p can be a metal other than molybdenum, or can be an alloy as long as the work function of the metal material is 4.8 eV or greater. Also, the gate insulation film 104 can make use of an insulation film having a dielectric constant that is higher than the silicon oxide layer.

Further, in the fourth embodiment, the passivation layer 503 is formed prior to the formation of the gate-sidewall insulation film 112, and the work function is lowered by carrying out heat treatment and eliminating the carbon from the N-type MOSFET molybdenum layer 502n, but the passivation layer 503 can be formed, and heat treatment carried out after the formation of the gate-sidewall insulation film 112, that is, in the state shown in FIG. 9D. In this case, in order to prevent the flocculation of the nickel silicide layers 117, 303, it is desirable that heat treatment for eliminating carbon be performed at temperatures less than 500° C. Further, in this case, since a silicon nitride layer has properties that prevent the passage of hydrogen and steam, it is desirable that a layer other than a silicon nitride layer be utilized as the gate-sidewall insulation film 112.

In addition, in the fourth embodiment, a molybdenum layer 502, which is a metal layer, and a polysilicon layer 302 having a nickel silicide layer 303 on its surface are stacked to form the gate electrodes 501n, 501p, but a gate electrode can be constituted using only a metal material in the same way as in the first embodiment.

Further, in the same way as in the third embodiment, a dummy gate electrode can be formed using a polysilicon layer, and a nickel silicide layer 117 can be formed on the surfaces of the gate-sidewall insulation film 112, and source/drain diffusion layers 115, 116, after which a first interlayer insulation film can be formed so as to cover the surface of the dummy gate electrode, and after the dummy gate electrode is replaced with a metal layer, such as, for example, molybdenum, a passivation layer 503 can be selectively formed on the surface of the N-type MOSFET formation region, and heat treatment can be applied to eliminate carbon. In this case, it is not necessary to strip the passivation layer 503 subsequent to heat treatment, and after depositing a second interlayer insulation film on the passivation layer 503, a wiring layer 121 can be formed as the top layer.

According to the plurality of embodiments described hereinabove, it is possible to achieve a semiconductor device and a manufacturing method therefor, which enables the formation of metal gate electrodes having different work functions in the P-type MOSFET and N-type MOSFET, without significantly increasing the number of manufacturing processes.

Having described the embodiments of the invention by referring to the accompanying drawings, it should be understood that the present invention is not limited to those precise embodiments and various changes and modifications thereof could be made by one skilled in the art without departing from the spirit or scope of the invention as defined in the appended claims.

What is claimed is:

1. A manufacturing method of a semiconductor device on which are formed an N-type MOS transistor and a P-type MOS transistor, the method comprising the steps of:

forming a gate insulation film on a semiconductor substrate;

forming a conductor film, which contains carbon and constitutes a gate electrode, on the surface of the gate insulation film in accordance with a formation method that uses an organic material;

forming an insulation film so as to cover at least a part of the gate electrode of the P-type MOS transistor; and heating the semiconductor substrate on which the insulation film is formed in a combination of an oxidizing environment and a reducing environment and reducing a carbon content of the conductor film of the N-type MOS transistor.

2. The manufacturing method of a semiconductor device according to claim 1, further comprising, subsequent to the heating process, a step of stripping the insulation film.

3. The manufacturing method of semiconductor device according to claim 1, wherein the conductor film of the N-type MOS transistor is either a metal material with a work function of not less than 4.8 eV but less than 5.1 eV, or an alloy comprising a plurality of metal materials with a work function of not less than 4.8 eV but less than 5.1 eV.

4. The manufacturing method of a semiconductor device according to claim 2, wherein the conductor film of the N-type MOS transistor is either a metal material with a work function of not less than 4.8 eV but less than 5.1 eV, or an alloy comprising a plurality of metal materials with a work function of not less than 4.8 eV but less than 5.1 eV.

5. The manufacturing method of a semiconductor device according to claim 1, further comprising, subsequent to the process of forming the conductor film, a process of forming, on the conductor film, a polysilicon film having a metal silicide layer on the surface thereof.

* * * * *